United States Patent
Jang et al.

(10) Patent No.: US 10,917,098 B2
(45) Date of Patent: Feb. 9, 2021

(54) PHASE DIFFERENCE DETECTORS AND DEVICES FOR DETECTING PHASE DIFFERENCE BETWEEN OSCILLATION SIGNALS

(71) Applicant: Samsung Electronics Co., Ltd., Suwon-si (KR)

(72) Inventors: Jaehyuk Jang, Hwaseong-si (KR); Sangwook Han, Seoul (KR); Shinwoong Kim, Suwon-si (KR); Jaeyoung Kim, Hwaseong-si (KR); Chulho Kim, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/704,486

(22) Filed: Dec. 5, 2019

(65) Prior Publication Data

US 2020/0389173 A1  Dec. 10, 2020

(30) Foreign Application Priority Data

Jun. 10, 2019 (KR) .................. 10-2019-0068269

(51) Int. Cl.
| | | |
|---|---|---|
| *H03D 3/24* | (2006.01) | |
| *H03L 7/089* | (2006.01) | |
| *H04B 3/52* | (2006.01) | |
| *H03L 7/099* | (2006.01) | |
| *H04B 3/54* | (2006.01) | |
| *H04L 7/033* | (2006.01) | |
| *H03L 7/087* | (2006.01) | |

(52) U.S. Cl.
CPC ............ *H03L 7/0891* (2013.01); *H03L 7/087* (2013.01); *H03L 7/099* (2013.01); *H04B 3/52* (2013.01); *H04B 3/54* (2013.01); *H04L 7/0332* (2013.01)

(58) Field of Classification Search
CPC ....... H03L 7/0891; H03L 7/087; H03L 7/099; H04B 3/52; H04B 3/54; H04L 7/0332
USPC ................................ 375/376, 373, 362, 354
See application file for complete search history.

(56) References Cited

U.S. PATENT DOCUMENTS

| | | |
|---|---|---|
| 8,867,482 B2 | 10/2014 | Murakami et al. |
| 9,246,498 B2 | 1/2016 | Shimura |
| 9,407,270 B2 | 8/2016 | Unruh |

(Continued)

FOREIGN PATENT DOCUMENTS

| | | |
|---|---|---|
| JP | 2012-244290 A | 12/2012 |
| KR | 10-2017-0118164 A | 10/2017 |

(Continued)

*Primary Examiner* — Zewdu A Kassa
(74) *Attorney, Agent, or Firm* — Harness, Dickey & Pierce, P.L.C.

(57) ABSTRACT

A device for wireless communication using a plurality of antennas including a first local oscillation generator configured to generate a first local oscillation signal for up-converting a first transmission signal, a second local oscillation generator configured to generate a second local oscillation signal for up-converting a second transmission signal, and a phase difference detector configured to, detect a first phase difference between the first local oscillation signal and the second local oscillation signal, and generate a first phase compensation signal based on the first phase difference for adjusting a phase of at least one of the first transmission signal or the second transmission signal.

18 Claims, 14 Drawing Sheets

(56) References Cited

U.S. PATENT DOCUMENTS

| | | | |
|---|---|---|---|
| 9,596,040 B2 | 3/2017 | Laaia et al. | |
| 9,893,875 B2 | 2/2018 | Zanuso et al. | |
| 9,979,408 B2 | 5/2018 | Mayer et al. | |
| 2008/0280574 A1* | 11/2008 | Rofougaran | H04B 7/10 455/126 |
| 2009/0304118 A1* | 12/2009 | Yuanzhu | H04B 7/0854 375/340 |
| 2018/0359010 A1 | 12/2018 | Lee et al. | |

FOREIGN PATENT DOCUMENTS

| | | |
|---|---|---|
| KR | 10-2018-0110234 A | 10/2018 |
| KR | 10-2018-0133754 A | 12/2018 |

* cited by examiner

PHASE DIFFERENCE DETECTORS AND DEVICES FOR DETECTING PHASE DIFFERENCE BETWEEN OSCILLATION SIGNALS

CROSS-REFERENCE TO RELATED APPLICATION

This application claims the benefit of Korean Patent Application No. 10-2019-0068269, filed on Jun. 10, 2019, in the Korean Intellectual Property Office, the disclosure of which is incorporated herein in its entirety by reference.

BACKGROUND

The inventive concepts relate to phase difference detectors for detecting a phase difference between oscillation signals and devices including the same.

In wireless communication, a signal including information may be up-converted or down-converted using an oscillation signal. For example, a baseband signal may be up-converted into a radio frequency (RF) signal using a local oscillation signal, and the RF signal may be output through an antenna. An RF signal received through an antenna may be down-converted into a baseband signal using a local oscillation signal. To increase throughput and/or efficiency in wireless communication, RF signals may be output or received through a plurality of antennas, and accordingly, a plurality of local oscillation signals may be used. In addition, with the increase in frequency bandwidth used for wireless communication, the frequency of local oscillation signals may also increase.

SUMMARY

The inventive concepts provide a phase difference detector for detecting a phase difference between local oscillation signals and a device including the same.

According to an aspect of the inventive concepts, there is provided a device for wireless communication using a plurality of antennas including a first local oscillation generator configured to generate a first local oscillation signal for up-converting a first transmission signal, a second local oscillation generator configured to generate a second local oscillation signal for up-converting a second transmission signal, and a phase difference detector configured to, detect a first phase difference between the first local oscillation signal and the second local oscillation signal, and generate a first phase compensation signal based on the first phase difference for adjusting a phase of at least one of the first transmission signal or the second transmission signal.

According to an aspect of the inventive concepts, there is provided a phase difference detector for compensating for a phase difference between a plurality of local oscillation signals, the phase difference detector including processing circuitry configured to, detect a first phase of a first local oscillation signal based on a first phase change of the first local oscillation signal, the first local oscillation signal being generated based on a reference oscillation signal, the first phase change representing a change from an initial phase of the first local oscillation signal during a sampling operation to a later phase of the first local oscillation signal during a detection operation, detect a second phase of a second local oscillation signal based on a second phase change of the second local oscillation signal, the second local oscillation signal being generated based on the reference oscillation signal, the second phase change representing a change from an initial phase of the second local oscillation signal during the sampling operation to a later phase of the second local oscillation signal during a detection operation, and generate a phase compensation signal based on the first phase and the second phase, the phase compensation signal corresponding to a phase difference between the first local oscillation signal and the second local oscillation signal.

According to an aspect of the inventive concepts, there is provided a device for wireless communication using a plurality of antennas, the device including a plurality of local oscillation generators configured to generate a plurality of local oscillation signals for up-converting a plurality of transmission signals based on a reference oscillation signal, and a phase difference detector configured to, detect a plurality of phase differences between a first local oscillation signal among the plurality of local oscillation signals and two or more other local oscillation signals among the plurality of local oscillation signals, and generate a plurality of phase compensation signals based on the plurality of phase differences, and a data processor configured to adjust a phase of at least one of the plurality of transmission signals based on the plurality of phase compensation signals.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
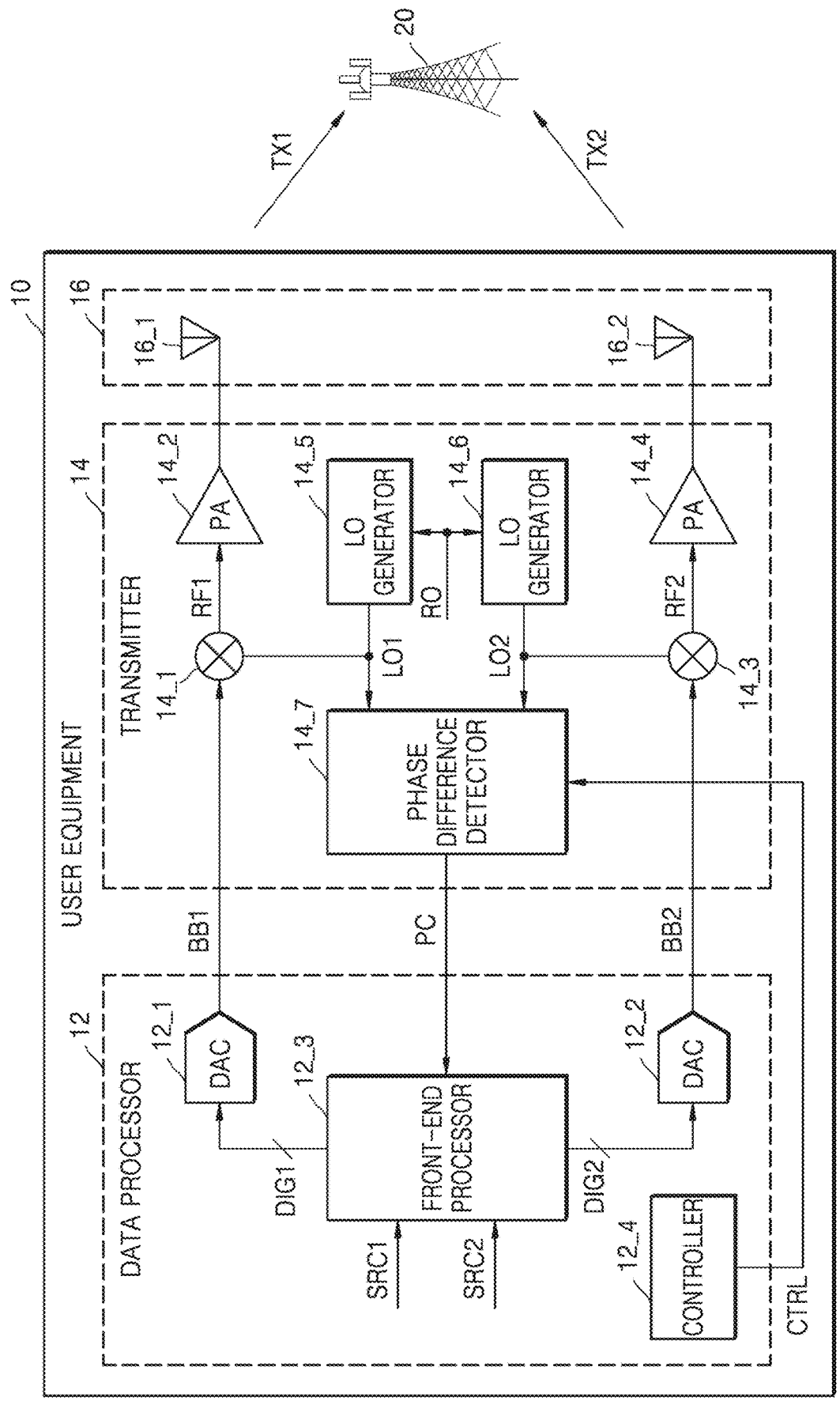
FIG. 1 is a block diagram of wireless communication equipment according to an example embodiment.

FIG. 1 is a block diagram of wireless communication equipment according to an example embodiment. In detail, FIG. 1 may show user equipment (UE) 10, which includes a phase difference detector 14_7, and a base station 20, according to an example embodiment.

A wireless communication system, in which the user equipment 10 and the base station 20 communicate with each other, may be, as a non-limiting example, a wireless communication system, such as a fifth generation wireless (5G) system, a long term evolution (LTE) system, an LTE advanced (LTE-A) system, a code division multiple access (CDMA) system, and/or a global system for mobile (GSM) system, using a cellular network, a wireless local area network (WLAN) system, and/or another wireless communication system. Hereinafter, a wireless communication system using a cellular network will be mainly referred to in the descriptions below, but example embodiments are not limited thereto.

The base station 20 may generally refer to a fixed station that may communicate with user equipment and/or another base station and may exchange data and/or control information with user equipment and/or another base station. For example, the base station 20 may be referred to as a node B, an evolved-node B (eNB), a next generation node B (gNB), a sector, a site, a base transceiver system (BTS), an access point (AP), a relay node, a remote radio head (RRH), a radio unit (RU), a cell, or a small cell. In this specification, a base station or a cell may be interpreted as referring to a partial area or function, which is covered by a base station controller (BSC) in CDMA, a node-B in wideband CDMA (WCDMA), an eNB in LTE, a gNB or a sector (or site) in 5G, or the like, in a comprehensive sense and may include various coverage regions, such as a mega cell, a macro cell, a micro cell, a pico cell, a femto cell, a relay node, an RRH, an RU, and a small-cell communication range.

The user equipment 10 may be stationary or mobile as a wireless communication device and may refer to a random device that may transmit and receive data and/or control information to and from a base station through wireless communication. For example, the user equipment 10 may be referred to as a terminal, terminal equipment, a mobile station (MS), a mobile terminal (MT), a user terminal (UT), a subscriber station (SS), a wireless device, or a portable device. Referring to FIG. 1, the user equipment 10 may include a data processor 12, a transmitter 14, and/or a plurality of antennas 16. Although it is illustrated in FIG. 1 that the user equipment 10 includes two antennas and the data processor 12 and the transmitter 14 have structure corresponding to the two antennas, it will be understood that the user equipment 10 may include three or more antennas and a data processor and a transmitter that have a structure corresponding to the three or more antennas. Hereinafter, description of example embodiments will be focused on the user equipment 10, but it will be understood that example embodiments may also be applied to other wireless communication equipment, e.g., the base station 20, different from the user equipment 10.

The user equipment 10 may perform transmission through the antennas 16 for, for example, spatial diversity, polarization diversity, beamforming, and/or spatial multiplexing. For example, the user equipment 10 and the base station 20 may support multi-input multi-output (MIMO), and as shown in FIG. 1, the user equipment 10 may provide the base station 20 with first transmission TX1 through a first antenna 16_1 and/or second transmission TX2 through a second antenna 16_2. The base station 20 may receive the first transmission TX1 and/or the second transmission TX2 through a plurality of antennas and/or extract information from the first transmission TX1 and/or the second transmission TX2.

While the first transmission TX1 and the second transmission TX2 may have the same carrier frequency or similar carrier frequencies, the base station 20 may experience a phase difference between the first transmission TX1 and the second transmission TX2. For example, the phase difference between the first transmission TX1 and the second transmission TX2 may be caused by a phase difference between a first local oscillation signal LO1 and a second local oscillation signal LO2, which may be used to generate the first transmission TX1 and the second transmission TX2, respectively, as described below, or by different traveling paths of the first transmission TX1 and the second transmission TX2. To compensate for the phase difference between the first transmission TX1 and the second transmission TX2, the user equipment 10 may generate the first transmission TX1 and the second transmission TX2 after compensating for a phase difference therebetween. For example, the data processor 12 may generate and provide a first baseband signal BB1 and a second baseband signal BB2, which have been compensated for a phase difference therebetween, to the transmitter 14. In this specification, the first baseband signal BB1 and the second baseband signal BB2, which are provided to the transmitter 14, may be simply referred to as transmission signals.

As shown in FIG. 1, the data processor 12 may include a first digital-to-analog converter (DAC) 12_1, a second DAC 12_2, a front-end processor 12_3, and/or a controller 12_4. The data processor 12 may be referred to as, for example, a baseband processor, a communication processor, a modem, and/or a baseband modem. According to some example embodiments, operations described herein as being performed by the user equipment 10, the base station 20, the data processor 12, the transmitter 14, the first DAC 12_1, the second DAC 12_2, the front-end processor 12_3, and/or the controller 12_4 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, the data processor 12 may include a hardware module designed through logic synthesis and/or a processing unit, which includes a processor and a software module including a series of instructions executed by the processor.

The first DAC 12_1 and the second DAC 12_2 may convert a first digital signal DIG1 and a second digital signal DIG2, respectively, which are provided from the front-end processor 12_3, into the first baseband signal BB1 and the second baseband signal BB2. In some embodiments, the first DAC 12_1 and the second DAC 12_2 may be included in the transmitter 14, and the first digital signal DIG1 and the second digital signal DIG2 may be provided from the data processor 12 to the transmitter 14. In some embodiments, the first DAC 12_1, the second DAC 12_2, and the front-end processor 12_3 may be included in the transmitter 14, and a first source signal SRC1 and a second source signal SRC2 may be provided from the data processor 12 to the transmitter 14.

The front-end processor 12_3 may receive the first source signal SRC1 and the second source signal SRC2 and may receive a phase compensation signal PC from the phase difference detector 14_7. The first source signal SRC1 may include information that is provided to the base station 20 via the first transmission TX1 and the second source signal SRC2 may include information that is provided to the base station 20 via the second transmission TX2. The front-end processor 12_3 may generate the first digital signal DIG1 and the second digital signal DIG2 which have adjusted phases based on the phase compensation signal PC from the first source signal SRC1 and the second source signal SRC2. In some embodiments, the front-end processor 12_3 may perform COordinate Rotation DIgital Computer (CORDIC) and may adjust the phase of at least one of the first digital signal DIG1 and the second digital signal DIG2 based on the phase compensation signal PC. Hereinafter, example embodiments will be described mainly referring to the case where the phase of the second digital signal DIG2 is adjusted based on the phase compensation signal PC to compensate for the phase difference between the first transmission TX1 and the second transmission TX2.

The controller 12_4 may generate a control signal CTRL for controlling the phase difference detector 14_7 included in the transmitter 14. For example, the phase difference detector 14_7 may perform a sampling operation and a detection operation, as described below with reference to FIG. 6 and so on, and the controller 12_4 may generate the control signal CTRL for activating each of the sampling operation and the detection operation.

The transmitter 14 may receive the first baseband signal BB1 and the second baseband signal BB2 from the data processor 12 and provide the phase compensation signal PC to the data processor 12. In addition, the transmitter 14 may output a plurality of signals for the first transmission TX1 and the second transmission TX2 to the antennas 16. As shown in FIG. 1, the transmitter 14 may include a first mixer 14_1, a first power amplifier (PA) 14_2, a second mixer 14_3, a second PA 14_4, a first local oscillation (LO) generator 14_5, a second LO generator 14_6, and/or the phase difference detector 14_7. The user equipment 10 may further include a receiver that may process signals received from the base station 20 through the antennas 16. In some embodiments, the transmitter 14 and the receiver may be collectively referred to as a transceiver and/or a radio frequency integrated circuit (RFIC). According to some example embodiments, operations described herein as being performed by the first mixer 14_1, the first PA 14_2, the second mixer 14_3, the second PA 14_4, the first LO generator 14_5, the second LO generator 14_6, and/or the phase difference detector 14_7 may be performed by processing circuitry.

The first mixer 14_1 may receive the first baseband signal BB1 and the first local oscillation signal LO1 and generate a first RF signal RF1 by up-converting the first baseband signal BB1 based on the frequency of the first local oscillation signal LO1. For example, the first local oscillation signal LO1 may have a frequency corresponding to a carrier frequency of the first transmission TX1. The first RF signal RF1 may be provided to the first PA 14_2 and an output signal of the first PA 14_2 may be provided to the first antenna 16_1.

Similarly, the second mixer 14_2 may receive the second baseband signal BB2 and the second local oscillation signal LO2 and generate a second RF signal RF2 by up-converting the second baseband signal BB2 based on the frequency of the second local oscillation signal LO2. For example, the second local oscillation signal LO2 may have a frequency corresponding to a carrier frequency of the second transmission TX2. The second RF signal RF2 may be provided to the second PA 14_4 and an output signal of the second PA 14_4 may be provided to the second antenna 16_2.

The first LO generator 14_5 and the second LO generator 14_6 may receive a reference oscillation signal RO and may generate the first local oscillation signal LO1 and the second local oscillation signal LO2, respectively, based on the reference oscillation signal RO. The reference oscillation signal RO may have a constant frequency. In some embodiments, the reference oscillation signal RO may be generated by a crystal oscillator and/or the like. In this specification, the first LO generator 14_5 and the second LO generator 14_6 may be collectively referred to as an LO generator and the first local oscillation signal LO1 and the second local oscillation signal LO2 may be collectively referred to as a local oscillation signal LO.

Though the first LO generator 14_5 and the second LO generator 14_6 may have the same structure or similar structures, and receive the reference oscillation signal RO in common, as shown in FIG. 1, a phase difference may occur between the first local oscillation signal LO1 and the second local oscillation signal LO2 and may also change. For example, each of the first LO generator 14_5 and the second LO generator 14_6 may include a phase locked loop (PLL), which may receive the reference oscillation signal RO, and a component, e.g., a delta-sigma modulator (DSM), which may provide a frequency division ratio of a fractional value on a feedback path of the PLL. Accordingly, a continuously changing value of the DSM may cause the phase difference between oscillation signals output from PLLs included in the first LO generator 14_5 and the second LO generator 14_6. In addition, each of the first LO generator 14_5 and the second LO generator 14_6 may include a frequency divider, which may generate the first local oscillation signal LO1 or the second local oscillation signal LO2 by dividing the frequency of an output signal of the PLL. Though the frequency of the output signal of the PLL is divided by an integer in the frequency divider, an edge of an output signal of the frequency divider, e.g., an oscillation signal, which is synchronized with an edge of the output signal of the PLL, may change, causing the phase difference between the first local oscillation signal LO1 and the second local oscillation signal LO2.

The phase difference detector 14_7 may receive the first local oscillation signal LO1 and the second local oscillation signal LO2 from the first LO generator 14_5 and the second LO generator 14_6, respectively, as shown in FIG. 1, and may generate the phase compensation signal PC by detecting a phase difference between the first local oscillation signal LO1 and the second local oscillation signal LO2 based on the control signal CTRL provided by the controller 12_4. Differently from FIG. 1, when the phases of the first local oscillation signal LO1 and the second local oscillation signal LO2 are adjusted to be synchronized with the reference oscillation signal RO in the first LO generator 14_5 and the second LO generator 14_6, respectively, the phase difference between the first local oscillation signal LO1 and the second local oscillation signal LO2 may still change due to a DSM included in a PLL, as described above. For example, as a frequency band for the first transmission TX1 and the second transmission TX2 increases, the transmitter 14 may be set in a sleep mode to reduce power consumption, and power supply to the first LO generator 14_5 and the second LO generator 14_6 as well as the first PA 14_2 and the second PA 14_4 may be cut off in the sleep mode. When the sleep mode is released, the phase difference between the first local oscillation signal LO1 and the second local oscillation signal LO2 generated by the first LO generator 14_5 and the second LO generator 14_6, respectively, to which power supply is resumed, may be different from the phase difference that has occurred before the sleep mode. Alternatively, as shown in FIG. 1, the phase difference detector 14_7 may generate the phase compensation signal PC by directly detecting the phase difference between the first local oscillation signal LO1 and the second local oscillation signal LO2, and the phase of the first baseband signal BB1 and/or the second baseband signal BB2 may be adjusted based on the phase compensation signal PC, and accordingly, the phase difference between the first RF signal RF1 and the second RF signal RF2 may be adaptively compensated for even though the phase difference between the first local oscillation signal LO1 and the second local oscillation signal LO2 changes. For example, based on a phase θ of the first local oscillation signal LO1, the first RF signal RF1 may be defined as Equation 1:

$$RF1 = I\cos(\omega t+\theta) + Q\sin(\omega t+\theta) = (I\cos\theta + Q\sin\theta)\cos\omega t + (Q\cos\theta - I\sin\theta)\sin\omega t \quad (1),$$

where I may be a baseband signal of an I-channel, Q may be a baseband signal of a Q-channel, ω may be angular velocity of the first local oscillation signal LO1, ant t may be time. When the phase of the first baseband signal BB1 is adjusted by θ by the front-end processor 12_3, the first RF signal RF1 may be defined as Equation 2, which may agree with Equation 1. In other words, an influence of the first local oscillation signal LO1 on the first RF signal RF1 may be compensated for by adjusting the phase of the first baseband signal BB1. Accordingly, the phase difference between the first local oscillation signal LO1 and the second local oscillation signal LO2 may be compensated for by adjusting the phase of the first baseband signal BB1 and/or the second baseband signal BB2.

$$RF1 = Re\{(I-jQ)\times(\cos\theta+j\sin\theta)\times(\cos\omega t+j\sin\omega t)\} = (I\cos\theta+Q\sin\theta)\cos\omega t + (Q\cos\theta - I\sin\theta)\sin\omega t \quad (2).$$

Figure 2:
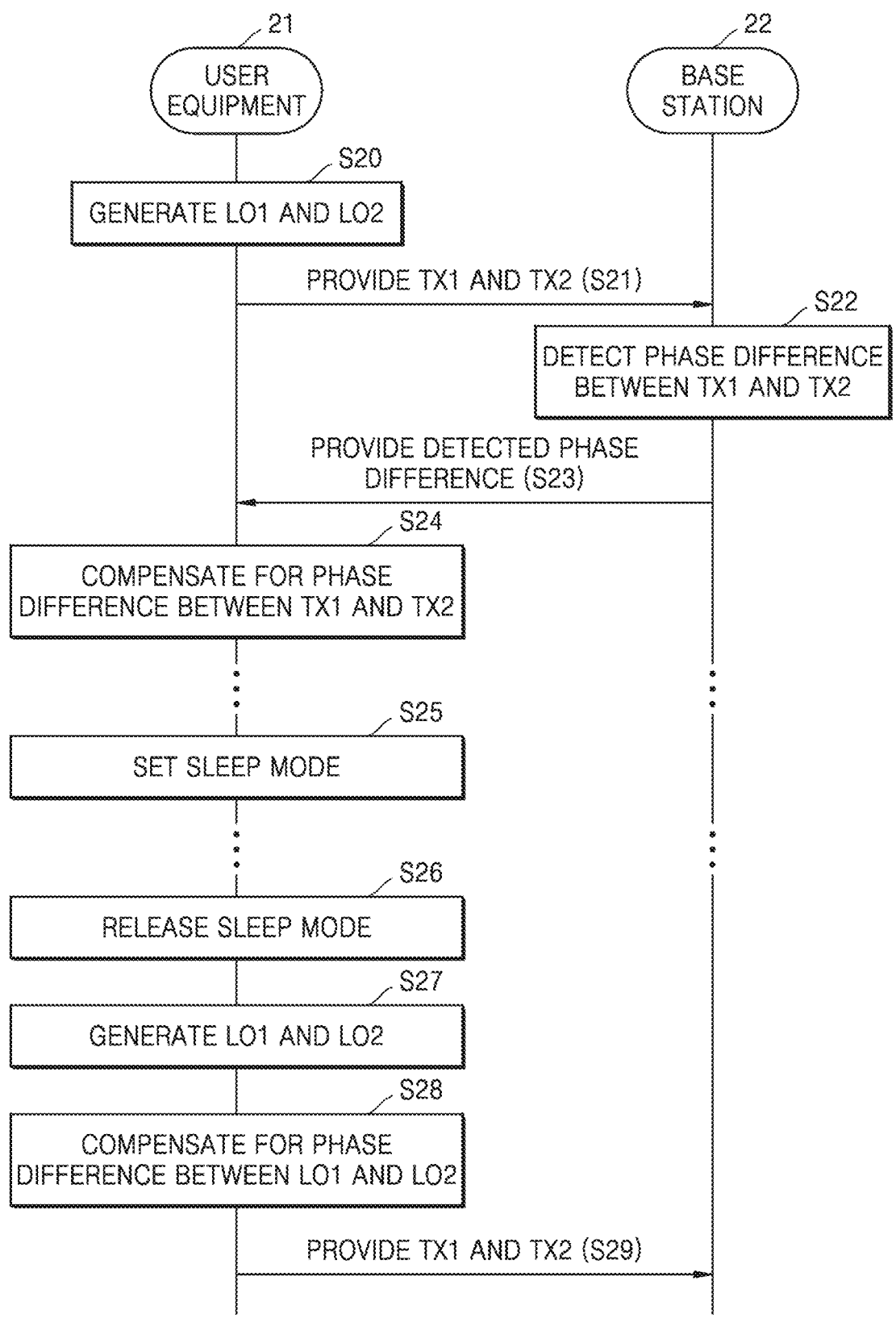
FIG. 2 is a diagram of an example of the operation of wireless communication equipment performing wireless communication, according to an example embodiment.

FIG. 2 is a diagram of an example of the operation of wireless communication equipment performing wireless communication, according to an example embodiment. Hereinafter, it is assumed that user equipment 21 in FIG. 2 includes the elements of the user equipment 10 in FIG. 1, and FIG. 2 will be described with reference to FIG. 1.

Referring to FIG. 2, the user equipment 21 may generate the first local oscillation signal LO1 and the second local oscillation signal LO2 in operation S20. As described above with reference to FIG. 1, the first local oscillation signal LO1 and the second local oscillation signal LO2 may have a frequency corresponding to the carrier frequency of the first transmission TX1 and the second transmission TX2, and the first LO generator 14_5 and the second LO generator 14_6 may generate the first local oscillation signal LO1 and the second local oscillation signal LO2, respectively, based on the reference oscillation signal RO. Thereafter, the user equipment 21 may provide the first transmission TX1 and the second transmission TX2 to a base station 22 in operation S21. For example, the user equipment 21 may output the first transmission TX1 and the second transmission TX2 through the first antenna 16_1 and the second antenna 16_2, respectively.

The base station 22 may detect a phase difference between the first transmission TX1 and the second transmission TX2 in operation S22. As described above with reference to FIG. 1, the base station 22 may experience the phase difference between the first transmission TX1 and the second transmission TX2 due to not only different paths of the first transmission TX1 and the second transmission TX2 but also the phase difference between the first local oscillation signal LO1 and the second local oscillation signal LO2. The base station 22 may provide the detected phase difference to the user equipment 21 in operation S23.

The user equipment 21 may compensate for the phase difference between the first transmission TX1 and the second transmission TX2 based on the phase difference provided from the base station 22 in operation S24. For example, the front-end processor 12_3 of the data processor 12 may obtain the phase difference provided from the base station 22 and compensate for the phase difference by adjusting the phase of the first digital signal DIG1 and/or the second digital signal DIG2. The first baseband signal BB1 and/or the second baseband signal BB2 may be generated from the phase-adjusted first digital signal DIG1 and/or the phase-adjusted second digital signal DIG2, and accordingly, the base station 22 may receive the phase-compensated first transmission TX1 and the phase-compensated second transmission TX2 after operation S24. The base station 22 may receive the first transmission TX1 and the second transmission TX2 through a plurality of antennas and restore the first transmission TX1 and the second transmission TX2 using a linear receiver or a non-linear receiver.

The user equipment 21 may set a sleep mode in operation S25. For example, the transmitter 14 may be set in the sleep mode, and accordingly, power supply to the first LO generator 14_5 and the second LO generator 14_6 may be cut off. Thereafter, the sleep mode may be released in operation S26 for transmission to the base station 22. For example, the sleep mode of the transmitter 14 may be released, and accordingly, power supply to the first LO generator 14_5 and the second LO generator 14_6 may be resumed.

The user equipment 21 may generate the first local oscillation signal LO1 and the second local oscillation signal LO2 in operation S27. As described above with reference to FIG. 1, the phase difference between the first local oscillation signal LO1 and the second local oscillation signal LO2, which are generated in operation S27, may be different from the phase difference between the first local oscillation signal LO1 and the second local oscillation signal LO2, which are generated in operation S20. Accordingly, although a channel environment between the user equipment 21 and the base station 22 has not been changed, the compensation of the phase difference between the first transmission TX1 and the second transmission TX2 in operation S24 may not be valid.

The user equipment 21 may compensate for the phase difference between the first local oscillation signal LO1 and the second local oscillation signal LO2 in operation S28. For example, the phase difference detector 14_7 may generate the phase compensation signal PC by detecting the phase difference between the first local oscillation signal LO1 and the second local oscillation signal LO2, and the front-end processor 12_3 may adjust the phase of the first digital signal DIG1 and/or the second digital signal DIG2 based on the phase compensation signal PC.

The user equipment 21 may provide the first transmission TX1 and the second transmission TX2 to the base station 22 in operation S29. When operation S28 is omitted or the phase difference between the first local oscillation signal LO1 and the second local oscillation signal LO2, which are generated in operation S27, is not properly compensated for, the base station 22 may newly experience the phase difference between the first transmission TX1 and the second transmission TX2, which are received in operation S29, and operations S22 and S24 are newly performed. As a result, the efficiency of wireless communication decreases. Contrarily, when the phase difference between the first local oscillation signal LO1 and the second local oscillation signal LO2 is compensated for in operation S28, the base station 22 may receive the phase-compensated first transmission TX1 and the phase-compensated second transmission TX2, and repetition of operations S22 and S24 may be prevented or reduced.

Figure 3:
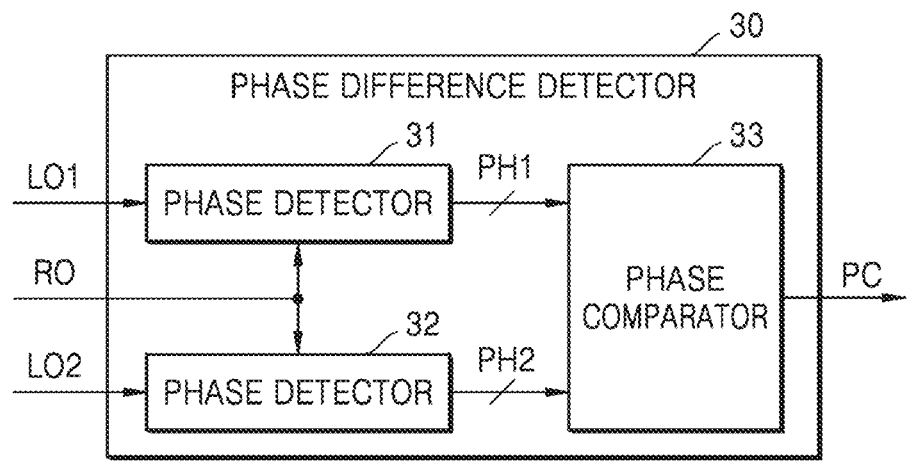
FIG. 3 is a block diagram of a phase difference detector according to an example embodiment.

FIG. 3 is a block diagram of a phase difference detector 30 according to an example embodiment. According to some example embodiments, the phase difference detector 14_7 discussed in association with FIG. 1 may be implemented using the phase difference detector 30. As described above with reference to FIG. 1, the phase difference detector 30 of FIG. 3 may receive the first local oscillation signal LO1 and the second local oscillation signal LO2 and generate the phase compensation signal PC by detecting the phase difference between the first local oscillation signal LO1 and the second local oscillation signal LO2. As shown in FIG. 3, the phase difference detector 30 may include a first phase detector 31, a second phase detector 32, and/or a phase comparator 33. Hereinafter, FIG. 3 will be described with reference to FIG. 1. According to some example embodiments, operations described herein as being performed by the phase difference detector 30, the first phase detector 31, the second phase detector 32 and/or the phase comparator 33 may be performed by processing circuitry.

The phase difference detector 30 may detect phases of the first local oscillation signal LO1 and the second local oscillation signal LO2 and compare the phases with each other to generate the phase compensation signal PC. For example, as shown in FIG. 3, the first phase detector 31 may generate a first phase signal PH1 by detecting the phase of the first local oscillation signal LO1 and the second phase detector 32 may generate a second phase signal PH2 by detecting the phase of the second local oscillation signal LO2. The first phase signal PH1 and the second phase signal PH2 may be digital signals and may represent the phase of the first local oscillation signal LO1 and the phase of the second local oscillation signal LO2, respectively. The first phase detector 31 and the second phase detector 32 may have the same structure as, or similar structures to, each other and may generate the first phase signal PH1 and the second phase signal PH2, respectively, based on the reference oscillation signal RO, as shown in FIG. 3. An example of the first and second phase detectors 31 and 32 will be described with reference to FIG. 4 below.

The phase comparator 33 may receive the first phase signal PH1 and the second phase signal PH2 from the first phase detector 31 and the second phase detector 32, respectively, and compare the phases represented by the first phase signal PH1 and the second phase signal PH2 with each other to generate the phase compensation signal PC. For example, the phase comparator 33 may determine (e.g., calculate) a difference between the phases represented by the first phase signal PH1 and the second phase signal PH2, e.g., a phase difference, and generate the phase compensation signal PC as a digital signal representing the phase difference. In some embodiments, the phase comparator 33 may include an adder and/or a subtractor.

Figure 4:
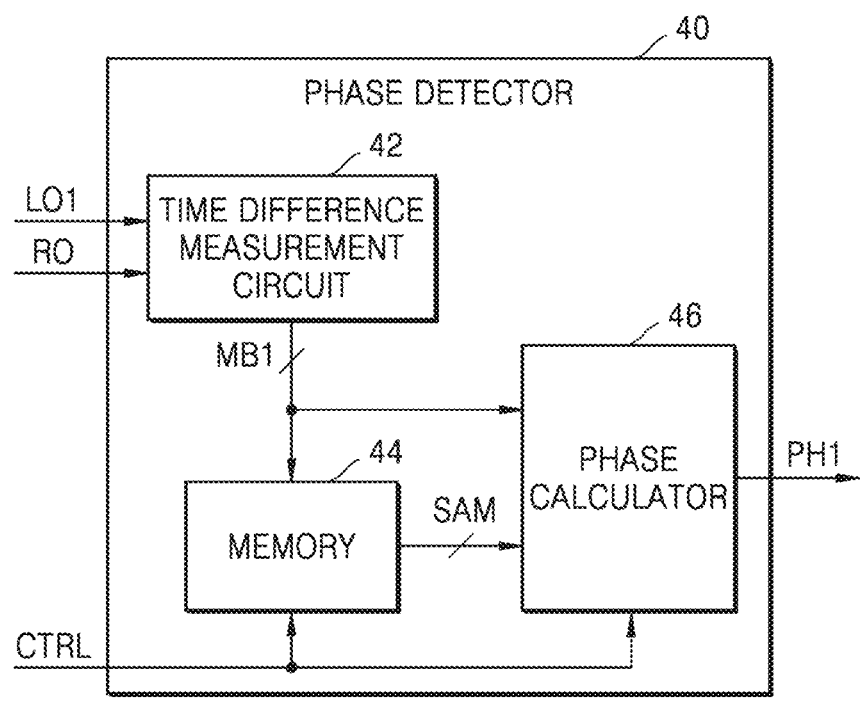
FIG. 4 is a diagram of a phase detector according to an example embodiment.

FIG. 4 is a diagram of a phase detector 40 according to an example embodiment. In detail, FIG. 4 may show an example of the first phase detector 31 in FIG. 3, and the second phase detector 32 in FIG. 3 may have the same structure as, or a similar structure to, the first phase detector 31 in FIG. 3. As shown in FIG. 4, the phase detector 40 may include a time difference measurement circuit 42, a memory 44, and/or a phase calculator 46. FIG. 4 will be described with reference to FIG. 1 below. According to some example embodiments, operations described herein as being performed by the phase detector 40, the time difference measurement circuit 42 and/or the phase calculator 46 may be performed by processing circuitry.

The phase detector 40 may receive the first local oscillation signal LO1 and the reference oscillation signal RO, as described above with reference to FIG. 3, and further receive the control signal CTRL. The phase detector 40 may perform a sampling operation or a detection operation according to the control signal CTRL. For example, the phase detector 40 may sample the phase of the first local oscillation signal LO1 during the sampling operation, and may detect the phase change of the first local oscillation signal LO1 based on the sampled phase of the first local oscillation signal LO1 and a detected phase thereof during the detection operation. Accordingly, the phase detector 40 may detect a difference between the phase of the first local oscillation signal LO1, which is sampled during the sampling operation, and the phase of the first local oscillation signal LO1, which is detected during the detection operation, as the phase of the first local oscillation signal LO1.

The time difference measurement circuit 42 may receive the first local oscillation signal LO1 and the reference oscillation signal RO and generate a first multi-bit signal MB1 representing a time difference between an edge of the first local oscillation signal LO1 and an edge of the reference oscillation signal RO. Accordingly, the first multi-bit signal MB1 may represent the phase difference between the first local oscillation signal LO1 and the reference oscillation signal RO. In some embodiments, the time difference measurement circuit 42 may be referred to as a time-to-digital converter (TDC). An example of the time difference measurement circuit 42 will be described with reference to FIG. 7.

The memory 44 may receive the first multi-bit signal MB1, store a value of the first multi-bit signal MB1, and provide a sample signal SAM having the stored value to the phase calculator 46. For example, the memory 44 may store the value of the first multi-bit signal MB1 in response to the control signal CTRL that may activate a sampling operation such that the value stored in the memory 44 may be updated. The memory 44 may include, as a non-limiting example, a volatile memory device such as a register, dynamic random access memory (DRAM), and/or static RAM (SRAM). In some embodiments, the memory 44 may include, as a non-limiting example, a non-volatile memory device such as flash memory and/or electrically erasable programmable read-only memory (EEPROM), and accordingly, the value stored in the memory 44 may be retained even when power supply to the phase difference detector 14_7 in FIG. 1 is cut off in a sleep mode.

The phase calculator 46 may receive the first multi-bit signal MB1 from the time difference measurement circuit 42 and the sample signal SAM from the memory 44 and generate the first phase signal PH1, which represents the phase of the first local oscillation signal LO1, based on the first multi-bit signal MB1 and the sample signal SAM. As described above, the phase calculator 46 may generate the first phase signal PH1, which corresponds to the difference between the phase represented by the sample signal SAM and the phase represented by the first multi-bit signal MB1 at present (e.g., during the detection operation). An example of the phase calculator 46 will be described with reference to FIG. 8.

Figure 5:
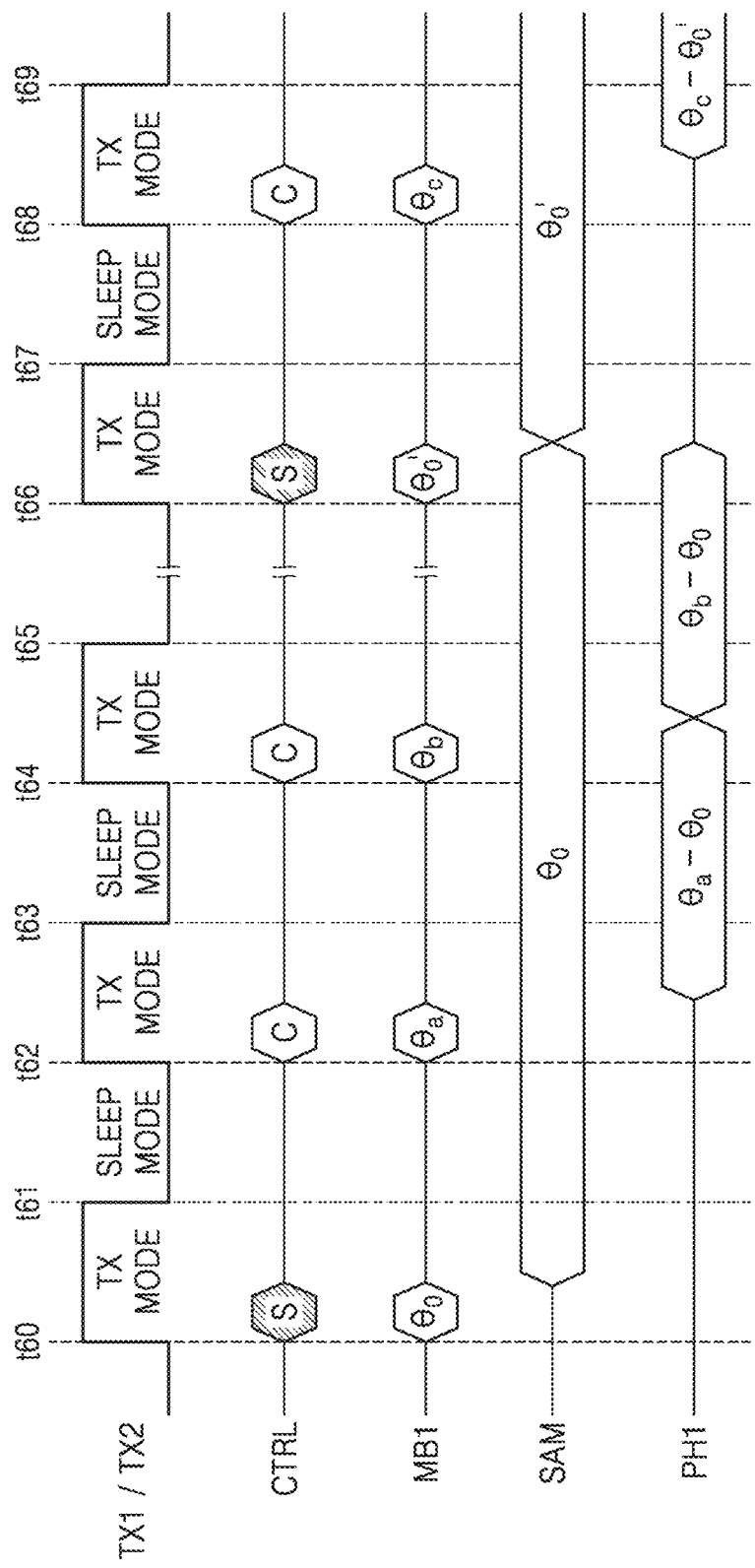
FIG. 5 is a timing diagram illustrating the operation of a phase detector, according to an example embodiment.

FIG. 5 is a timing diagram illustrating the operation of a phase detector, according to an example embodiment. In detail, FIG. 5 may show signals, which are received and/or generated by the phase detector 40 of FIG. 4, over time. As described above with reference to FIG. 4, the phase detector 40 may perform a sampling operation and a detection operation according to the control signal CTRL, and FIG. 5 will be described with reference to FIGS. 1 and 4.

Referring to FIG. 5, a transmission mode (or a TX mode) may be activated at a time t60. In the TX mode, the user equipment 10 may perform transmission to the base station 20 and, unlike in the sleep mode, may supply power to all elements of the transmitter 14 to perform the transmission. As denoted by "S" in FIG. 5, the controller 12_4 may generate the control signal CTRL that may activate a sampling operation, and accordingly, the first multi-bit signal MB1 may represent $\theta_0$ corresponding to the phase difference between the reference oscillation signal RO and the first local oscillation signal LO1. The memory 44 may store the value of the first multi-bit signal MB1 in response to the activation of a sampling operation and thus store $\theta_0$, as shown in FIG. 5. In this specification, $\theta_0$ detected in response to the control signal CTRL activating a sampling operation may be referred to as an initial phase of the first local oscillation signal LO1, and $\theta 0$ stored in the memory 44 may be referred to as initial phase information.

At a time t61, the TX mode may be released and the sleep mode may be activated. For example, the user equipment 10 may cut off power supply to at least one element of the transmitter 14 to reduce power consumption. For example, while power supply to the first LO generator 14_5 generating the first local oscillation signal LO1 may be cut off and the generation of the first local oscillation signal LO1 may be interrupted, $\theta_0$ stored in the memory 44 may be retained.

At a time t62, the sleep mode may be released and the TX mode may be activated. Accordingly, power may be supplied to all elements of the transmitter 14. As denoted by "C" in FIG. 5, the controller 12_4 may generate the control signal CTRL that may activate a detection operation, and accordingly, the first multi-bit signal MB1 may represent $\theta_a$ corresponding to the phase difference between the reference oscillation signal RO and the first local oscillation signal LO1 (also referred to herein as a "later phase"). As described above with reference to the drawings, although the first local oscillation signal LO1 is generated based on the reference oscillation signal RO, $\theta_0$ detected at the time t60 may be different from $\theta_a$ detected at the time t62 due to various causes. The phase calculator 46 may generate the first phase signal PH1, which represents a difference, e.g., $\theta_a - \theta_0$, between the phase $\theta_0$ represented by the sample signal SAM and the phase $\theta_a$ represented by the first multi-bit signal MB1, in response to the activation of a detection operation. Accordingly, in the TX mode activated at the time t62, the phase difference between the first local oscillation signal LO1 and the second local oscillation signal LO2 may be compensated for. Similarly, at a time t64 at which the sleep mode activated at a time t63 is released, the phase detector 40 may generate the first phase signal PH1, which represents a difference, e.g., $\theta_b - \theta_0$, between the phase $\theta_0$ represented by the sample signal SAM and the phase $\theta_b$ represented by the first multi-bit signal MB1, in response to the control signal CTRL activating a detection operation.

At a time t66, the TX mode may be activated. Differently from the times t62 and t64, at a time t66, the controller 12_4 may generate the control signal CTRL activating a sampling operation, as denoted by "S" in FIG. 5, and accordingly, the first multi-bit signal MB1 may represent $\theta_0'$ corresponding to the phase difference between the reference oscillation signal RO and the first local oscillation signal LO1. The memory 44 may store the value of the first multi-bit signal MB1 in response to the activation of a sampling operation and thus store $\theta_0'$, as shown in FIG. 5. The controller 12_4 may activate a sampling operation as done at the time t66 to update the value stored in the memory 44 (e.g., at a determined time and/or interval). An example of the operation of the controller 12_4 generating the control signal CTRL will be described with reference to FIG. 6 below.

At a time t68, the sleep mode set at a time t67 may be released and the TX mode may be activated. Accordingly, power may be supplied to all elements of the transmitter 14, and as denoted by "C" in FIG. 5, the controller 12_4 may generate the control signal CTRL that may activate a detection operation. Accordingly, the phase detector 40 may generate the first phase signal PH1, which represents a difference, e.g., $\theta_c - \theta_0'$, between the phase $\theta_0'$ represented by the sample signal SAM and the phase $\theta_c$ represented by the first multi-bit signal MB1. At a time t69, the TX mode may be released and $\theta_0'$ stored in the memory 44 may be retained.

Figure 6:
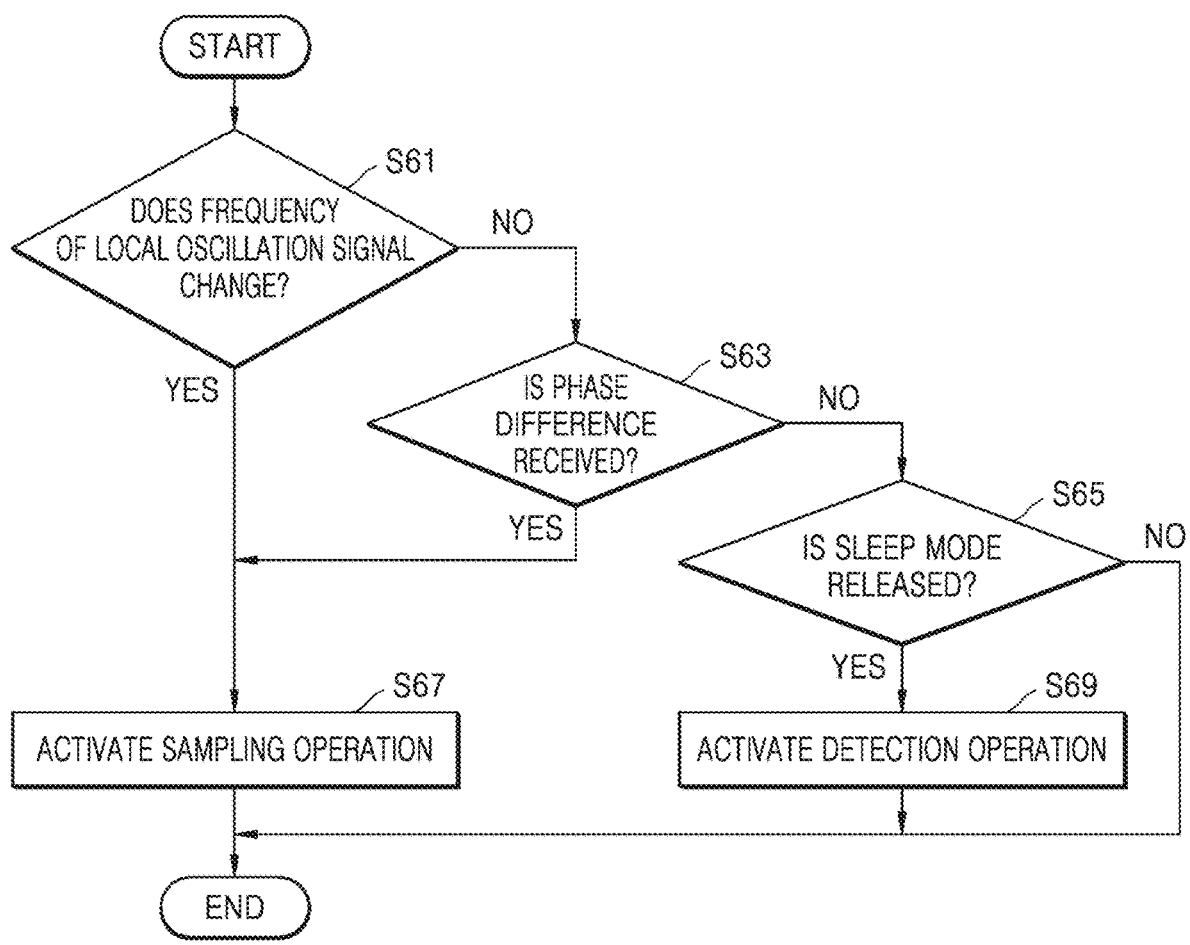
FIG. 6 is a flowchart of the operations of a controller, according to an example embodiment.

FIG. 6 is a flowchart of the operations of a controller, according to an example embodiment. In detail, FIG. 6 may show an example of an operation performed by the controller 12_4 in FIG. 1 to generate the control signal CTRL. FIG. 6 will be described with reference to FIG. 1 below.

As described above with reference to FIG. 1, the controller 12_4 may control sampling and detection operations of the phase difference detector 14_7 (or the phase detector 40 of FIG. 4) using the control signal CTRL. During a sampling operation, the phase of the first local oscillation signal LO1 may be sampled and stored. The phase of the first local oscillation signal LO1 may be detected based on a phase of the first local oscillation signal LO1 detected during a detection operation and the sampled phase. As described below, the controller 12_4 may activate a sampling operation when the phase difference between the first transmission TX1 and the second transmission TX2 changes due to factors other than the first LO generator 14_5 and the second LO generator 14_6 and may activate a detection operation when the phase difference changes due to the first LO generator 14_5 and the second LO generator 14_6.

Referring to FIG. 6, whether a frequency of a local oscillation signal changes may be determined in operation S61. For example, the frequency of the first local oscillation signal LO1 and the second local oscillation signal LO2 may correspond to a carrier frequency, and the carrier frequency may vary with a frequency band used for the first transmission TX1 and the second transmission TX2. When the carrier frequency changes due to a change in the frequency band between the user equipment 10 and the base station 20 (e.g., a change in the frequency band because of a start of wireless communication with another base station than the base station 20, or the like) the controller 12_4 may determine that the frequency of the first local oscillation signal LO1 and the second local oscillation signal LO2 is changed. When the carrier frequency changes, a phase difference may change due to not only the first and second LO generators 14_5 and 14_6 but also the paths of the first transmission TX1 and the second transmission TX2. Accordingly, when the frequency of the local oscillation signal changes, a sampling operation may be activated in operation S67. Contrarily, when the frequency of the local oscillation signal does not change, operation S63 may be performed.

Whether a phase difference is received may be determined in operation S63. As described above with reference to FIG. 2, the base station 20 may detect a phase difference based on the first transmission TX1 and the second transmission TX2 and provide the phase difference to the user equipment 10. When the phase difference is received, a sampling operation may be activated in operation S67, and a current phase difference between the first local oscillation signal LO1 and the second local oscillation signal LO2 may be stored in memory (e.g., the memory 44 in FIG. 4). Contrarily, when the phase difference is not received from the base station 20, operation S65 may be performed.

Whether a sleep mode is released may be determined in operation S65. When the sleep mode is released, that is, when a TX mode is activated, power may be supplied to all elements of the transmitter 14, and the first LO generator 14_5 and the second LO generator 14_6 may generate the first local oscillation signal LO1 and the second local oscillation signal LO2, respectively. When the sleep mode is released, a detection operation may be activated in operation S69. Otherwise, the method of FIG. 6 may end.

Figure 7:
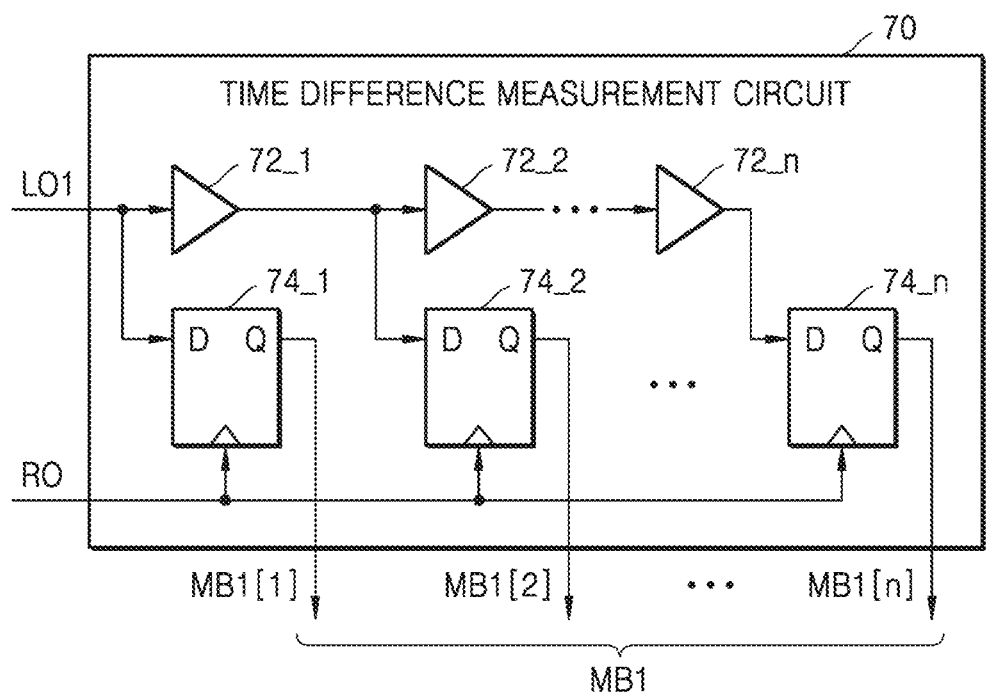
FIG. 7 is a block diagram of a time difference measurement circuit according to an example embodiment.

FIG. 7 is a block diagram of a time difference measurement circuit 70 according to an example embodiment. In detail, FIG. 7 may show an example of the time difference measurement circuit 42 in FIG. 4. As described above with reference to FIG. 4, the time difference measurement circuit 70 of FIG. 7 may receive the first local oscillation signal LO1 and the reference oscillation signal RO and output the first multi-bit signal MB1 as a digital signal. As shown in FIG. 7, the time difference measurement circuit 70 may include a series of delay cells 72_1, 72_2, . . . , and 72_n and a plurality of flip-flops 74_1, 74_2, . . . , and 74_n, where "n" is an integer greater than 1. FIG. 7 will be described with reference to FIG. 1 below. According to some example embodiments, operations described herein as being performed by the time difference measurement circuit 70, the delay cells 72_1, 72_2, . . . , and 72_n, and/or the plurality of flip-flops 74_1, 74_2, . . . , and 74_n may be performed by processing circuitry.

The reference oscillation signal RO may have a constant frequency of, for example, several tens to several hundreds of MHz and the first local oscillation signal LO1 may have a higher frequency than the reference oscillation signal RO. For example, the frequency of the first local oscillation signal LO1 may correspond to a carrier frequency and may be equal to or greater than 6 GHz in a wireless communication system (e.g., 5G) using millimeter wave (mmWave). To measure a time difference between an edge of the reference oscillation signal RO and an edge of the first local oscillation signal LO1, the time difference measurement circuit 70 may delay the first local oscillation signal LO1 and generate the first multi-bit signal MB1 by sampling signals delayed from the first local oscillation signal LO1 according to the reference oscillation signal RO.

As shown in FIG. 7, the first local oscillation signal LO1 may sequentially pass through the delay cells 72_1 through 72_n. In some embodiments, the time difference measurement circuit 70 may further include another delay cell connected to the last delay cell 72_n for the load of the last delay cell 72_n. The delay cells 72_1 through 72_n may have the same structure or similar structures, and thus provide the same delay or substantially the same delay.

The flip-flops 74_1 through 74_n may receive output signals of the delay cells 72_1 through 72_n, respectively, e.g., the signals delayed from the first local oscillation signal LO1, and may sample the delayed signals at an edge (e.g., a rising edge) of the reference oscillation signal RO. As shown in FIG. 7, output signals of the flip-flops 74_1 through 74_n may form bits MB1[1] through MB1[n] (e.g., bits MB1[1], MB1[2], . . . , and MB1[n]), respectively, of the first multi-bit signal MB1. Accordingly, as described with reference to FIGS. 9A and 9B below, the bits MB1[1] through MB1[n] of the first multi-bit signal MB1 may represent a waveform of the first local oscillation signal LO1. The structure of the time difference measurement circuit 70 of FIG. 7 is just an example, and the time difference measurement circuit 70 may use any structure for measuring a time difference between an edge of the reference oscillation signal RO and an edge of the first local oscillation signal LO1.

In some embodiments, the time difference measurement circuit 70 may be disposed near the first LO generator 14_5. As described above, the first local oscillation signal LO1 may have a high frequency of at least 6 GHz, and therefore, the time difference measurement circuit 70 may be disposed near the first LO generator 14_5 to minimize or reduce the attenuation of the first local oscillation signal LO1 due to a path from the first LO generator 14_5 to the time difference measurement circuit 70. Similarly to the time difference measurement circuit 70 included in the first phase detector 31 in FIG. 3, a time difference measurement circuit included in the second phase detector 32 in FIG. 3 may be disposed near the second LO generator 14_6. In some embodiment, the time difference measurement circuit 70 may be disposed nearer to the first LO generator 14_5 than to the second LO generator 14_6. Since the first multi-bit signal MB1 output from the time difference measurement circuit 70 disposed nearer the first LO generator 14_5 is a digital signal, information loss due to attenuation by a path from the time difference measurement circuit 70 to the memory 44 or to the phase calculator 46 may be small. As described above, a digital signal for phase difference detection may be generated near the first LO generator 14_5, and therefore, the accuracy of phase difference detection may be increased.

Figure 8:
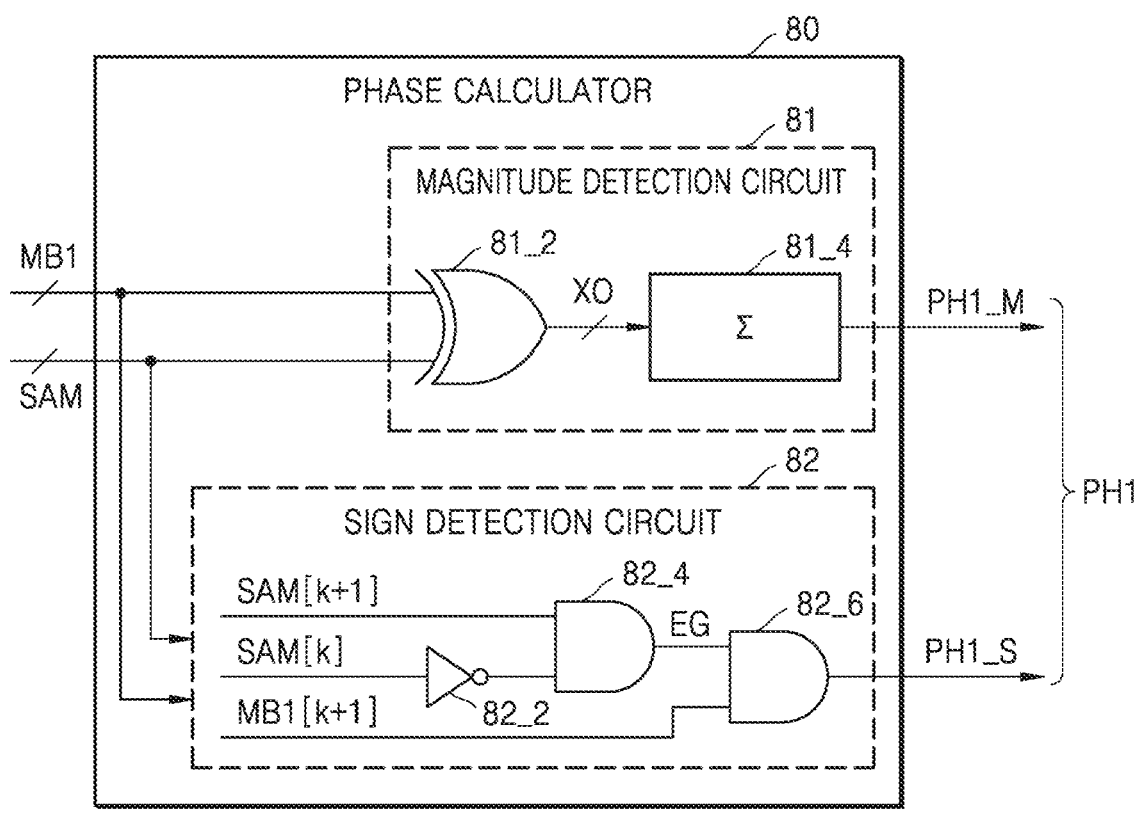
FIG. 8 is a block diagram of a phase calculator according to an example embodiment.

FIG. 8 is a block diagram of a phase calculator 80 according to an example embodiment. In detail, FIG. 8 may show an example of the phase calculator 46 in FIG. 4. As described above with reference to FIG. 4, the phase calculator 80 of FIG. 8 may receive the first multi-bit signal MB1 and the sample signal SAM and generate the first phase signal PH1. As shown in FIG. 8, the phase calculator 80 may include a magnitude detection circuit 81 and/or a sign detection circuit 82 and the first phase signal PH1 may include a first magnitude signal PH1_M output from the magnitude detection circuit 81 and/or a first sign signal PH1_S output from the sign detection circuit 82.

The magnitude detection circuit 81 may detect a magnitude of the difference between a phase represented by the sample signal SAM and a phase represented by the first multi-bit signal MB1 and generate the first magnitude signal PH1_M representing the detected magnitude (or an absolute value). As shown in FIG. 8, the magnitude detection circuit 81 may include an XOR gate 81_2, which perform a bitwise XOR operation on the sample signal SAM and the first multi-bit signal MB1, and/or a summer 81_4, which sums the bits of an output signal XO of the XOR gate 81_2. Examples of the operation of the magnitude detection circuit 81 will be described with reference to FIGS. 9A and 9B below.

The sign detection circuit 82 may detect a sign of the difference between the phase represented by the sample signal SAM and the phase represented by the first multi-bit signal MB1 and generate the first sign signal PH1_S representing the detected sign. In some embodiments, the sign detection circuit 82 may detect a rising and/or a falling edge in the waveform of the first local oscillation signal LO1, the waveform being represented by the first multi-bit signal MB1 and/or the sample signal SAM, and may detect a sign according to a value of the sample signal SAM and/or the first multi-bit signal MB1 at the detected edge. For example, as shown in FIG. 8, the sign detection circuit 82 may include an inverter 82_2 and a first AND gate 82_4 to detect a rising edge in the waveform of the first local oscillation signal LO1, which is represented by the sample signal SAM, based on adjacent bits SAM[k] and SAM[k+1] (where 1<k<n and "k" is an integer) in the sample signal SAM and may generate an edge signal EG indicating a rising edge. In addition, the sign detection circuit 82 may include a second AND gate 82_6, which may receive the edge signal EG and a bit MB1[$k$+1] in the first multi-bit signal MB1 and may generate the first sign signal PH1_S. Examples of the operation of the sign detection circuit 82 will be described with reference to FIGS. 10A and 10B below. According to some example embodiments, operations described herein as being performed by the phase calculator 80, the magnitude detection circuit 81, the sign detection circuit 82 and/or the summer 81_4 may be performed by processing circuitry.

Figure 9A:
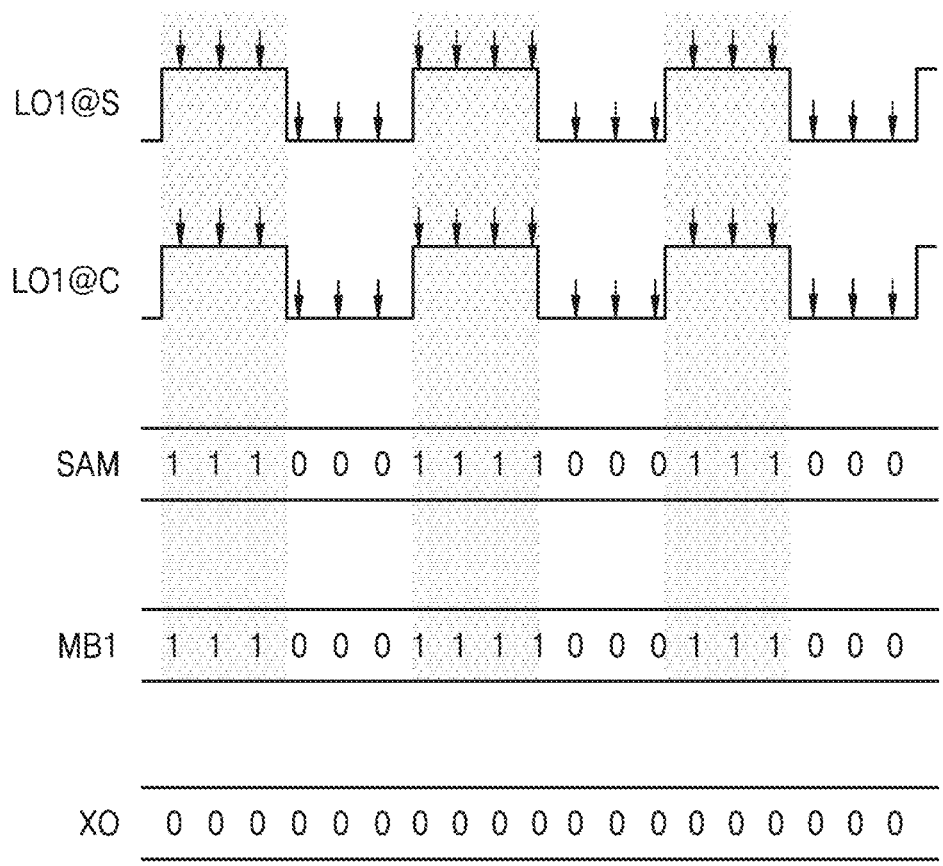
FIGS. 9A and 9B are timing diagrams illustrating operations of detecting a magnitude of the phase difference between oscillation signals, according to example embodiments.
Figure 9B:
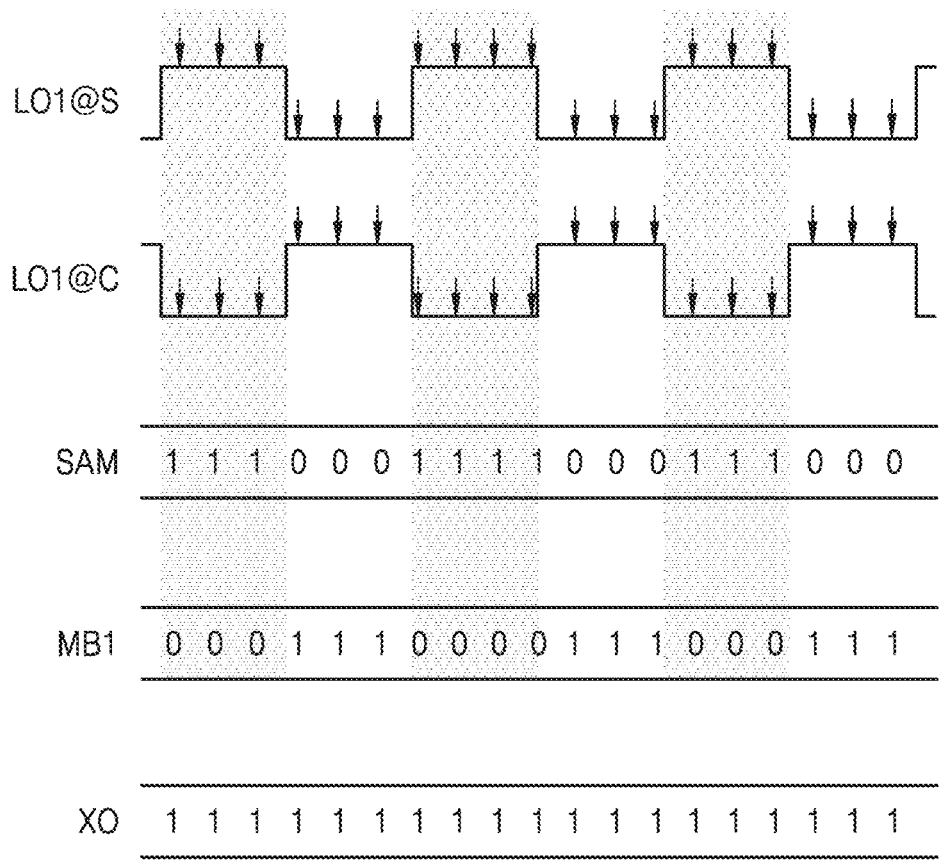

FIGS. 9A and 9B are timing diagrams illustrating operations of detecting a magnitude of the phase difference between oscillation signals, according to example embodiments. In detail, FIGS. 9A and 9B may illustrate examples of the operation of the magnitude detection circuit 81, and may correspond to different phase differences. As described above with reference to FIG. 8, the magnitude detection circuit 81 in FIG. 8 may detect a magnitude of the difference between a phase represented by the sample signal SAM and a phase represented by the first multi-bit signal MB1. Hereinafter, FIGS. 9A and 9B will be described with reference to FIG. 8, and redundant descriptions will be omitted.

Referring to FIG. 9A, a first local oscillation signal during a sampling operation, which is denoted by "LO1@S" in FIG. 9A, may have the same phase as or a similar phase to a first local oscillation signal during a detection operation, which is denoted by "LO1@C" in FIG. 9A. As described above with reference to FIG. 8, signals delayed from the first local oscillation signal LO1 by the series of delay cells 72_1 through 72_$n$ may be sampled, and accordingly, the first local oscillation signal LO1 may be considered as being sampled at points shown by arrows in FIG. 9A. Therefore, the sample signal SAM shown in FIG. 9A may be generated from the first sampling local oscillation signal LO1@S and the first multi-bit signal MB1 shown in FIG. 9A may be generated from the first detection local oscillation signal LO1@C. As shown in FIG. 9A, the sample signal SAM and the first multi-bit signal MB1 may have the same value or similar values, and accordingly, the output signal XO of the XOR gate 81_2 may include bits of zeros.

Referring to FIG. 9B, the first detection local oscillation signal LO1@C may have a 180° phase difference from the first detection local oscillation signal LO1 @C in FIG. 9A. Accordingly, while the sample signal SAM in FIG. 9B may have the same values as, or similar values to, the sample signal SAM in FIG. 9A, the first multi-bit signal MB1 in FIG. 9B may have an inverted value of the first multi-bit signal MB1 in FIG. 9A. Accordingly, the output signal XO of the XOR gate 81_2 may include bits of ones.

As described above, the output signal XO of the XOR gate 81_2 may have a minimum value (or lowest value) at a phase difference of 0° and a maximum value (or highest value) at a phase difference of 180°, and when a phase difference is greater than 0° and less than 180°, the output signal XO may have a number of bits of ones in proportion to the magnitude of the phase difference. Accordingly, the first magnitude signal PH1_M that is the sum of the bits of the output signal XO of the XOR gate 81_2 may represent the magnitude of the difference between a phase represented by the sample signal SAM and a phase represented by the first multi-bit signal MB1.

Due to a process variation or the like, a time difference measurement circuit (e.g., the time difference measurement circuit 70 of FIG. 7) included in the first phase detector 31 in FIG. 3 may be different from a time difference measurement circuit included in the second phase detector 32 in FIG. 3. Accordingly, a delay of the first local oscillation signal LO1 and a delay of the second local oscillation signal LO2, of which each is provided by a delay cell included in a time difference measurement circuit, may be different from each other. However, since each of the phases of the first local oscillation signal LO1 and the second local oscillation signal LO2 is generated or calculated based on the sample signal SAM, previously obtained by the same time difference measurement circuit or a similar time difference measurement circuit, as the phase of the first or second local oscillation signal LO1 or LO2, as described above, phases detected by the first phase detector 31 and the second phase detector 32 may correspond to the phase of the first local oscillation signal LO1 and the phase of the second local oscillation signal LO2, respectively, regardless of a process variation and/or the like. In addition, since the number of bits (e.g., "n") of a multi-bit signal output from the time difference measurement circuit included in the first phase detector 31 is the same as or similar to that from the time difference measurement circuit included in the second phase detector 32, phase magnitude signals obtained by adding the bits of the output signal XO of the XOR gate 81_2 may be compared with each other (e.g., may be used to determine a difference in phase magnitudes between previous and currently sampled oscillation signals).

Figure 10A:
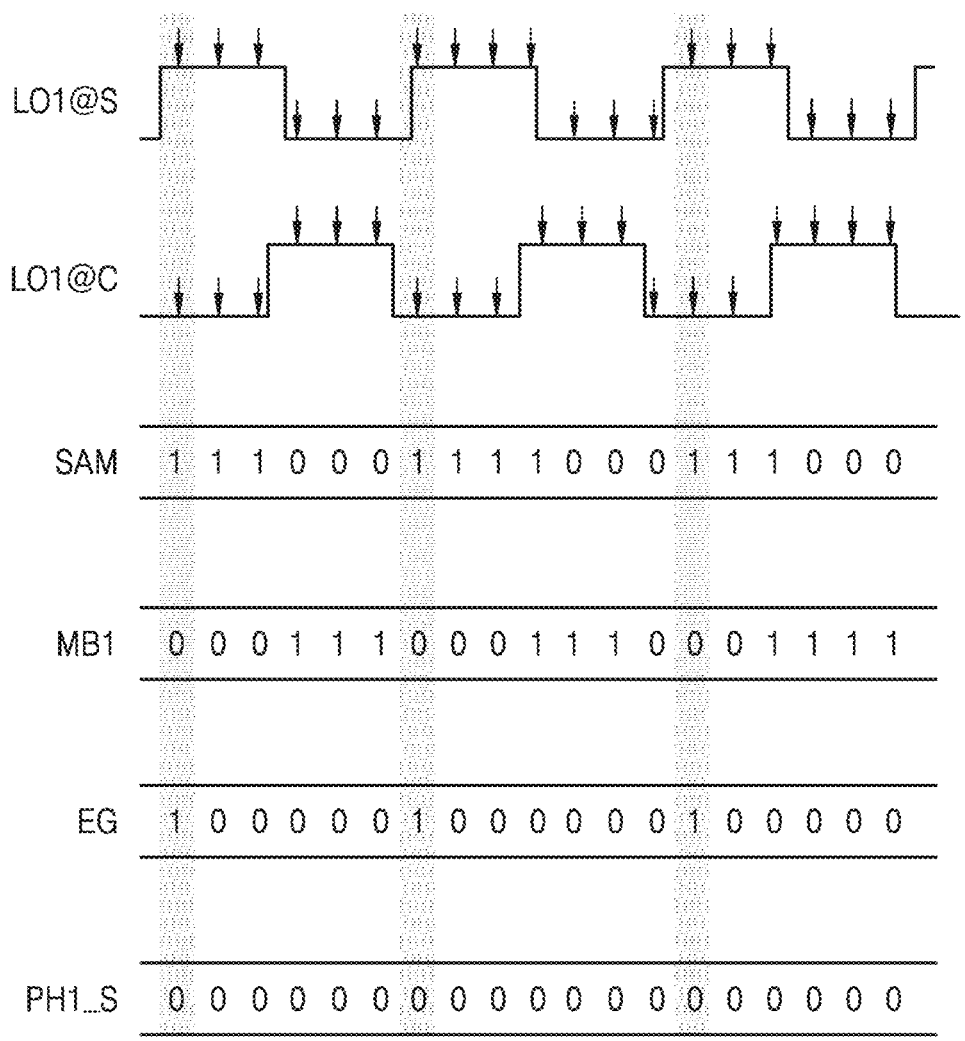
FIGS. 10A and 10B are timing diagrams illustrating operations of detecting a sign of the phase difference between oscillation signals, according to example embodiments.
Figure 10B:
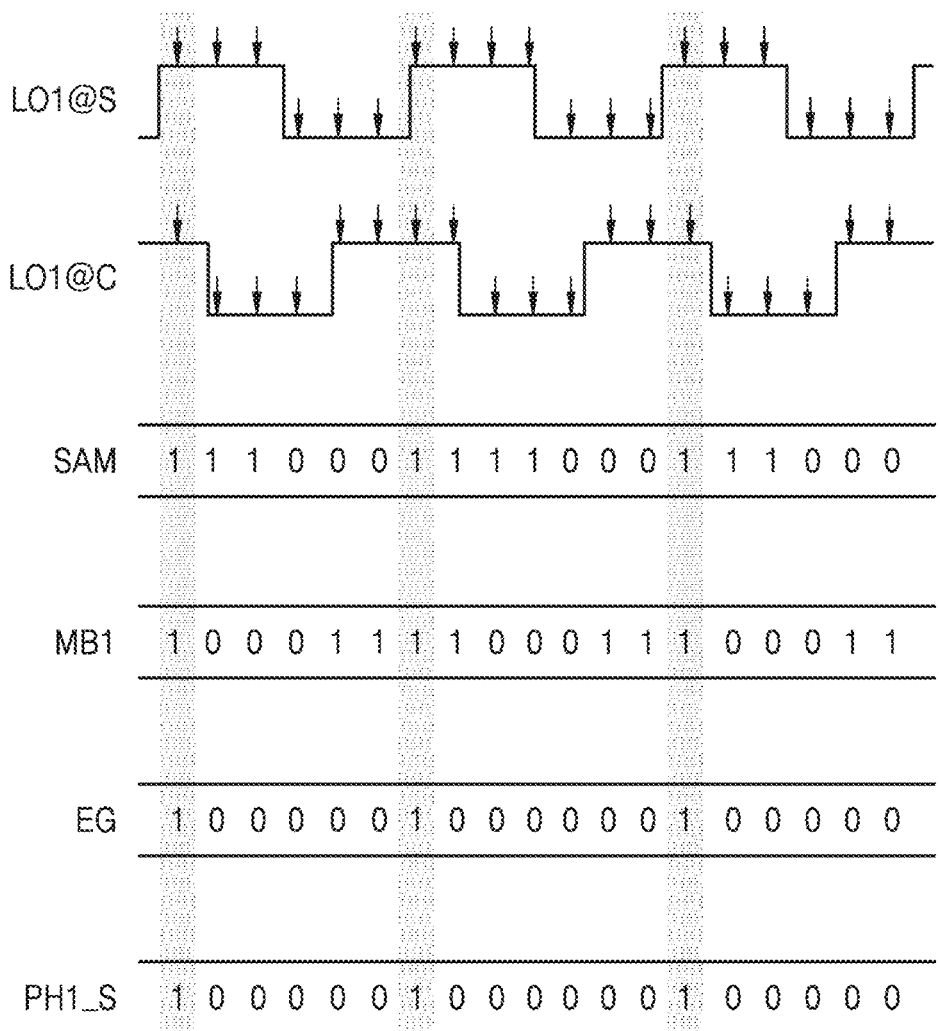

FIGS. 10A and 10B are timing diagrams illustrating operations of detecting a sign of the phase difference between oscillation signals, according to example embodiments. In detail, FIGS. 10A and 10B may illustrate examples of the operation of the sign detection circuit 82, and may correspond to different phase differences. As described above with reference to FIG. 8, the sign detection circuit 82 in FIG. 8 may detect a sign of the difference between a phase represented by the sample signal SAM and a phase represented by the first multi-bit signal MB1. Hereinafter, FIGS. 10A and 10B will be described with reference to FIG. 8, and redundant descriptions will be omitted.

Referring to FIG. 10A, the first sampling local oscillation signal LO1@S may lead the first detection local oscillation signal LO1 @C. As shown in FIG. 10A, the edge signal EG may have a bit of one (also referred to herein as a bit value of '1') at a point corresponding to a rising edge of a waveform represented by the sample signal SAM. Since a bit in the first multi-bit signal MB1, which corresponds to the bit of one in the edge signal EG, is zero, the first sign signal PH1_S may have a bit of zero (also referred to herein as a bit value of '0') indicating that the first sampling local oscillation signal LO1@S leads the first detection local oscillation signal LO1@C.

Referring to FIG. 10B, the first sampling local oscillation signal LO1 @S lags the first detection local oscillation signal LO1@C. As shown in FIG. 10B, the edge signal EG may have a bit of one at a point corresponding to a rising edge of a waveform represented by the sample signal SAM. Since a bit in the first multi-bit signal MB1, which corresponds to the bit of one in the edge signal EG, is one, the first sign signal PH1_S may have a bit of one indicating that the first sampling local oscillation signal LO1@S lags the first detection local oscillation signal LO1@C.

As described above with reference to FIGS. 9A through 10B, since the first magnitude signal PH1_M in FIG. 8 may represent a magnitude of a phase difference ranging from 0° to 180° and the first sign signal PH1_S may represent a sign of the phase difference, the first phase signal PH1 may represent a phase difference ranging from 0° to 180°. Although a method of detecting a sign of a phase difference using a rising edge of a waveform represented by the sample signal SAM has been described with reference to FIGS. 8, 10A and 10B, a falling edge of the waveform represented by the sample signal SAM may be alternatively or additionally used in some embodiments or a rising edge and/or a falling edge of a waveform represented by the first multi-bit signal MB1 may be used in some embodiments.

Figure 11:
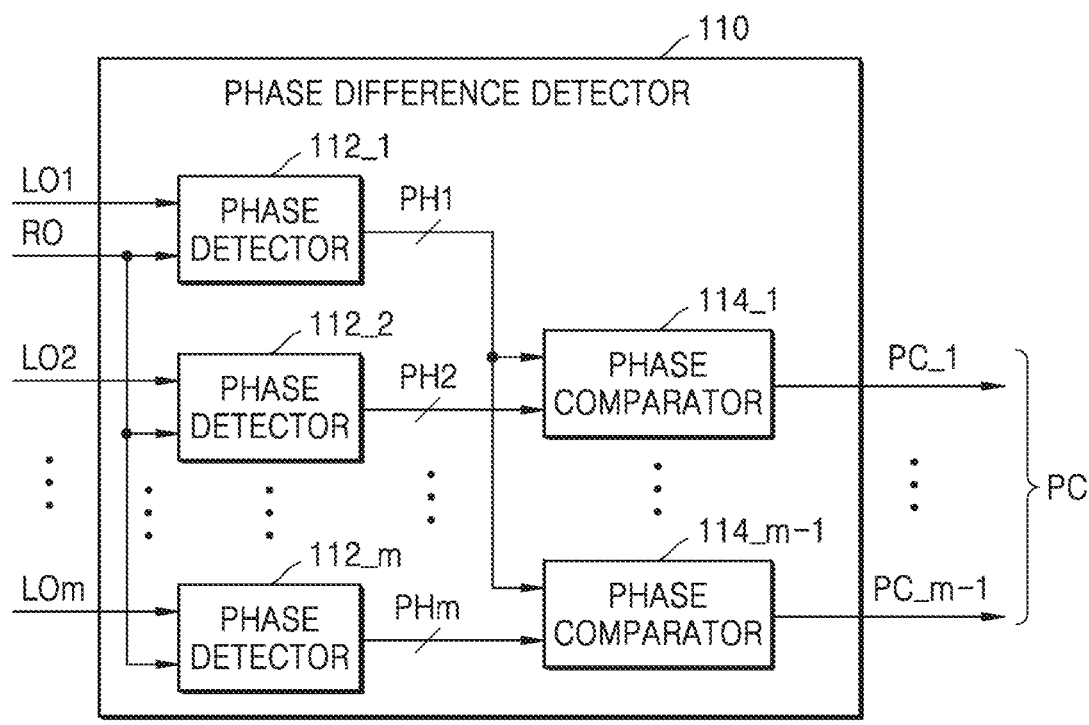
FIG. 11 is a block diagram of a phase difference detector for detecting phase differences among at least three oscillations signals according to an example embodiment.

FIG. 11 is a block diagram of a phase difference detector 110 for detecting phase differences among at least three local oscillation signals according to an example embodiment. According to some example embodiments, the phase difference detector 14_7 discussed in association with FIG. 1 may be implemented using the phase difference detector 110. In detail, FIG. 11 may show the phase difference detector 110 detecting phase differences among at least three local oscillation signals. For transmission through at least three antennas, at least three LO generators may be provided. According to some example embodiments, each of the at least three LO generators may be the same as or similar to one of both of the first LO generator 14_5 and/or the second LO generator 14_6 discussed in association with FIG. 1. The phase difference detector 110 may receive at least three local oscillation signals, e.g., first through m-th local oscillation signals LO1, LO2, . . . , and LOm, and detect a phase difference between one of the first through m-th local oscillation signals LO1 through LOm and each of the others of the first through m-th local oscillation signals LO1 through LOm. As shown in FIG. 11, the phase difference detector 110 may include a plurality of first through m-th phase detectors 112_1, 112_2, . . . , and 112_m and a plurality of first through (m–1)-th phase comparators 114_1 through 114_m–1, where "m" is an integer greater than 2. According to some example embodiments, each of the plurality of first through m-th phase detectors 112_1, 112_2, . . . , and 112_m may be the same as or similar to one or more of the first phase detector 31, the second phase detector 32 and/or the phase detector 40 discussed in association with FIGS. 3-4. According to some example embodiments, each of the plurality of first through (m–1)-th phase comparators 114_1 through 114_m–1 may be the same as or similar to the phase comparator 33 discussed in association with FIG. 3. According to some example embodiments, operations described herein as being performed by the phase difference detector 110 may be performed by processing circuitry.

Referring to FIG. 11, the first phase detector 112_1 may generate the first phase signal PH1 corresponding to a phase of the first local oscillation signal LO1 from the first local oscillation signal LO1 and the reference oscillation signal RO. The second phase detector 112_2 may generate the second phase signal PH2 corresponding to a phase of the second local oscillation signal LO2 from the second local oscillation signal LO2 and the reference oscillation signal RO. The m-th phase detector 112_m may generate an m-th phase signal PHm corresponding to a phase of the m-th local oscillation signal LOm from the m-th local oscillation signal LOm and the reference oscillation signal RO. As described above with reference to FIG. 7, a time difference measurement circuit included in each of the first through m-th phase detectors 112_1 through 112_m may be disposed near an LO generator.

The first phase comparator 114_1 may compare a phase corresponding to the first phase signal PH1 with a phase corresponding to the second phase signal PH2 (e.g., may determine a phase difference between the first local oscillation signal LO1 and the second local oscillation signal LO2) and generate a first phase compensation signal PC_1 for adjusting a phase for transmission through a second antenna (e.g., a second antenna of the user equipment 10). The (m–1)-th phase comparator 114_m–1 may generate an (m–1)-th phase compensation signal PC_m–1 (e.g., may determine a phase difference between the first local oscillation signal LO1 and the m-th local oscillation signal LOm) for adjusting a phase for transmission through an m-th antenna (e.g., an m-th antenna of the user equipment 10). Accordingly, the phase difference detector 110 may generate the phase compensation signal PC including the first phase compensation signal PC_1, which represents the phase difference between the first local oscillation signal LO1 and the second local oscillation signal LO2, and the (m–1)-th phase compensation signal PC_m–1, which represents the phase difference between the first local oscillation signal LO1 and the m-th local oscillation signal LOm.

Figure 12:
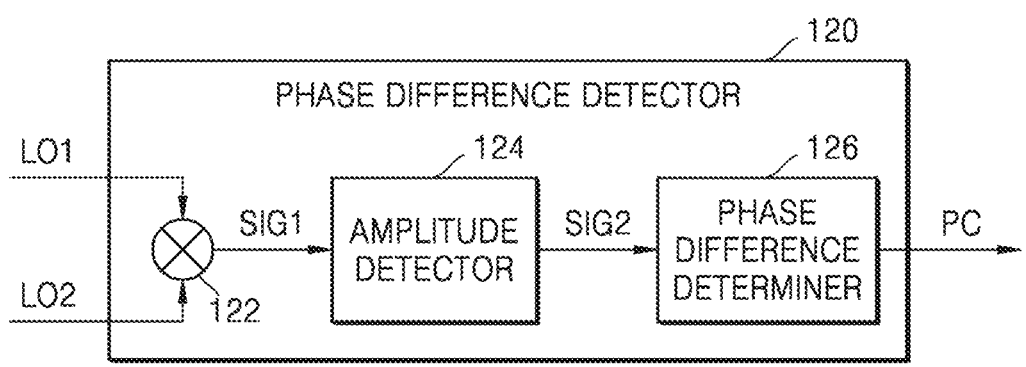
FIG. 12 is a block diagram of a phase difference detector including a phase difference determiner according to an example embodiment.

FIG. 12 is a block diagram of a phase difference detector 120 including a phase difference determiner according to an example embodiment. In detail, FIG. 12 may show an example of the phase difference detector 14_7 in FIG. 1. As described above with reference to FIG. 1, the phase difference detector 120 of FIG. 12 may receive the first local oscillation signal LO1 and the second local oscillation signal LO2 and generate the phase compensation signal PC. As shown in FIG. 12, the phase difference detector 120 may include a mixer 122, an amplitude detector 124, and/or a phase difference determiner 126. FIG. 12 will be described with reference to FIG. 1 below. According to some example embodiments, operations described herein as being performed by the phase difference detector 120, the mixer 122, the amplitude detector 124 and/or the phase difference determiner 126 may be performed by processing circuitry.

The mixer 122 may receive the first local oscillation signal LO1 and the second local oscillation signal LO2 and output a first signal SIG1. When the phase of the first local oscillation signal LO1 coincides with the phase of the second local oscillation signal LO2, the first signal SIG1 may have a great amplitude. Contrarily, when the phase of the first local oscillation signal LO1 is different from the phase of the second local oscillation signal LO2, the amplitude of the first signal SIG1 may decrease.

The amplitude detector 124 may detect the amplitude of the first signal SIG1 from the mixer 122 and generate a second signal SIG2 representing the detected amplitude. For example, the amplitude detector 124 may include a loss-pass filter and/or an envelope detection circuit and generate the second signal SIG2 having a magnitude (e.g., voltage and/or current) proportional to a magnitude of the amplitude.

The phase difference determiner 126 may receive the second signal SIG2 from the amplitude detector 124 and generate the phase compensation signal PC based on the magnitude of the second signal SIG2. In some embodiments, the phase difference determiner 126 may include a DAC, which may generate the phase compensation signal PC by converting the second signal SIG2 into a digital signal. In some embodiments, the phase difference determiner 126 may internally generate or externally receive a plurality of reference signals and compare the second signal SIG2 with the reference signals to generate the phase compensation signal PC.

Figure 13:
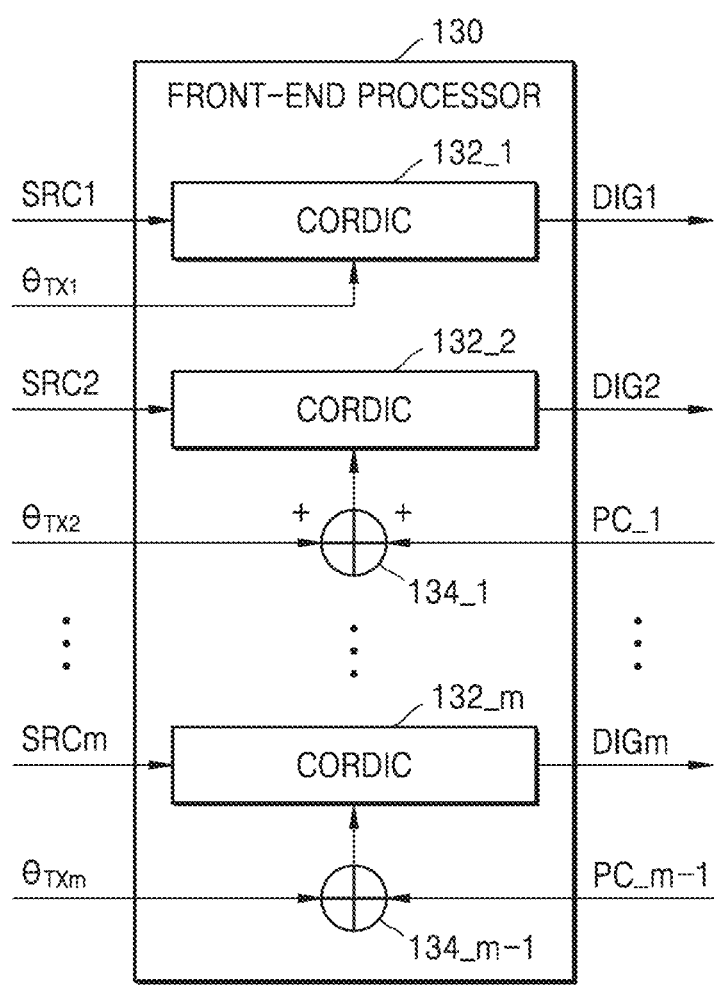
FIG. 13 is a block diagram of a front-end processor according to an example embodiment.

FIG. 13 is a block diagram of a front-end processor 130 according to an example embodiment. According to some example embodiments, the front-end processor 12_3 discussed in association with FIG. 1 may be implemented using the front-end processor 130. In detail, FIG. 13 may show the front-end processor 130 that may compensate for a phase difference based on the phase compensation signal PC provided by the phase difference detector 110 of FIG. 11, which may detect phase differences among at least three local oscillation signals. As shown in FIG. 13, the front-end processor 130 may include a plurality of first through m-th CORDIC blocks 132_1, 132_2, . . . , and 132_m and a plurality of first through (m−1)-th adders 134_1 through 134_m−1, where "m" is an integer greater than 2. In some embodiments, the elements except the first CORDIC block 132_1, the second CORDIC block 132_2, and the first adder 134_1 may be omitted from a front-end processor, e.g., the front-end processor 12_3 in FIG. 1, which may compensate for a phase difference between two local oscillation signals (e.g., LO1 and LO2). FIG. 13 will be described with reference to FIG. 11 below. According to some example embodiments, operations described herein as being performed by the front-end processor 130, the first through m-th CORDIC blocks 132_1, 132_2, . . . , and 132_m, and/or the first through (m−1)-th adders 134_1 through 134_m-1 may be performed by processing circuitry.

The first through m-th CORDIC blocks 132_1 through 132_m may generate a plurality of first through m-th digital signals DIG1 through DIGm (e.g., first digital signal DIG1, second digital signal DIG2, . . . , and m-th digital signal DIGm), respectively, from a plurality of first through m-th source signals SRC1 through SRCm (e.g., first source signal SRC1, second source signal SRC2, . . . , and m-th source signal SRCm) by performing CORDIC. For example, the first source signal SRC1 may include I data and Q data, and the first CORDIC block 132_1 may generate the first digital signal DIG1, which corresponds to a waveform of a baseband signal, based on the I data and the Q data. As shown in FIG. 13, the first CORDIC block 132_1 may receive a first transmission phase $\theta_{TX1}$ and generate the first digital signal DIG1 corresponding to a waveform, of which the phase has been adjusted according to the first transmission phase $\theta_{TX1}$.

A phase represented by the phase compensation signal PC provided from the phase difference detector 110 of FIG. 11 may be added to a transmission phase, and an added phase may be provided to a CORDIC block. For example, as shown in FIG. 13, the first adder 134_1 may receive a second transmission phase $\theta_{TX2}$ and the first phase compensation signal PC_1, which represents a phase difference detected between the first local oscillation signal LO1 and the second local oscillation signal LO2, and provide an added phase, which is obtained by adding the second transmission phase $\theta_{TX2}$ and a phase represented by the first phase compensation signal PC_1, to the second CORDIC block 132_2. Similarly, the (m−1)-th adder 134_m−1 may provide an added phase, which is obtained by adding the m-th transmission phase $\theta_{TXm}$ and a phase represented by the (m−1)-th phase compensation signal PC_m−1, to the m-th CORDIC block 132_m.

Figure 14:
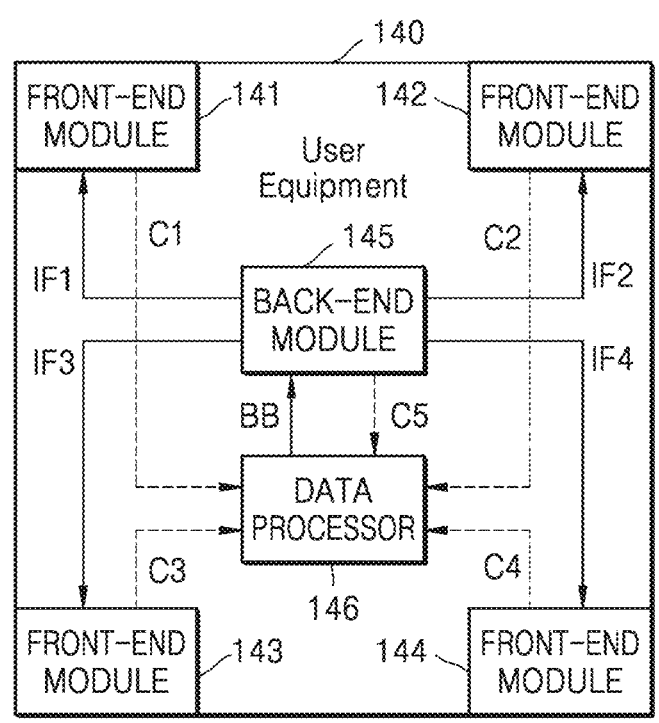
FIG. 14 is a block diagram of user equipment according to an example embodiment.

FIG. 14 is a block diagram of user equipment according to an example embodiment. In detail, FIG. 14 may show user equipment 140 that includes a plurality of front-end modules. As shown in FIG. 14, the user equipment 140 may include first through fourth front-end modules 141 through 144 (e.g., the first front-end module 141, the second front-end module 142, the third front-end module 143, and the fourth front-end module 144), a back-end module 145, and/or a data processor 146.

For satisfactory transmission and/or reception of a signal having strong straightness or high-frequency like mmWave, the user equipment 140 may include front modules separated from each other. Each of the front modules may include a plurality of antennas and may be referred to as an antenna module. For example, as shown in FIG. 14, the first through fourth front-end modules 141 through 144 may be disposed near an edge of the user equipment 140 and separated from one another and each may include an antenna array. Accordingly, even when signal transmission and reception through a certain front-end module is blocked by a user or other obstacles, signals may be transmitted and/or received through other front-end modules.

The first through fourth front-end modules 141 through 144 may further include a plurality of mixers corresponding to an antenna array and may generate RF band signals by up-converting first through fourth intermediate frequency signals IF1 through IF4, respectively, received from the back-end module 145. For this operation, each of the first through fourth front-end modules 141 through 144 may include a plurality of LO generators, which provide a plurality of local oscillation signals to the mixers, and a phase difference detector (e.g., the phase difference detector 30, the phase difference detector 110, and/or the phase difference detector 120), which may detect a phase difference between the local oscillation signals according to an embodiment. Accordingly, as shown in FIG. 14, the first through fourth front-end modules 141 through 144 may provide first through fourth phase compensation signals C1 through C4 (e.g., the first phase compensation signal C1, the second phase compensation signal C2, the third phase compensation signal C3, and the fourth phase compensation signal C4), respectively, to the data processor 146, and the data processor 146 may adjust the phase of a baseband signal BB based on the first through fourth phase compensation signals C1 through C4.

The back-end module 145 may receive the baseband signal BB from the data processor 146 and generate the first through fourth intermediate frequency signals IF1 through IF4 (e.g., the intermediate frequency signal IF1, the second intermediate frequency signal IF2, the third intermediate frequency signal IF3, and the fourth intermediate frequency signal IF4) by up-converting the baseband signal BB. For this operation, the back-end module 145 may include a mixer and an LO generator. In some embodiments, two or more of the first through fourth front-end modules 141 through 144 may perform wireless communication with a base station (e.g., the base station 20 in FIG. 1). For example, when the first front-end module 141 and third front-end module 143 perform wireless communication with a base station, the back-end module 145 may provide the first intermediate frequency signal IF1 and the third intermediate frequency signal IF3 to the first front-end module 141 and third front-end module 143, respectively. The data processor 146 may receive the first and third phase compensation signals C1 and C3 from the first and third front-end modules 141 and 143, respectively, and a fifth phase compensation signal C5 from a phase detector (e.g., the phase detector 40) included in the back-end module 145. The fifth phase compensation signal C5 represents a phase difference between local oscillation signals used to generate the first and third intermediate frequency signals IF1 and IF3. Accordingly, the data processor 146 may adjust the phase of the baseband signal BB based on the first phase compensation signal C1, the third phase compensation signal C3, and/or the fifth phase compensation signal C5.

Although not shown in FIG. 14, the data processor 146 may include a controller (e.g., the controller 12_4 in FIG. 1) that may control phase difference detectors, which may be included in the first through fourth front-end modules 141 through 144 and/or the back-end module 145, and may control signals generated by the controller may be provided to the phase difference detectors. According to some example embodiments, operations described herein as being performed by the user equipment 140, the first front-end module 141, the second front-end module 142, the third front-end module 143, the fourth front-end module 144, the data processor 146, and/or the back-end module 145 may be performed by processing circuitry.

Conventional UEs that communicate using MIMO determine a phase difference between transmissions output through different antennas based on phase difference information received from a received of the transmissions. The conventional UEs adjust the transmissions to compensate for phase differences based on the phase difference information. Such phase difference information includes phase differences caused by the different traveling paths corresponding to the antennas, as well as phase differences of local oscillation signals. When the phase differences of the local oscillation signals change (e.g., due to a continuously changing value of a DSM used to generate the local oscillation signals, recovery from a sleep mode, etc.), the conventional UEs repeat the process of sending transmissions to the receiver and receiving new phase difference information from the receiver in order to re-adjust the transmissions based on the new phase difference information. Such repetition of operations reduces communication efficiency and/or results in excessive resource consumption (e.g., power, processor, etc.).

However, according to some example embodiments, a UE 10 is provided that may determine the phase differences of the local oscillation signals at the UE 10 and adjust baseband signals based on the determined phase differences. The UE 10 may generate transmission signals based on the adjusted baseband signals, and send the transmission signals to the receiver. Accordingly, the UE 10 may adjust the transmission signals based on changed phase differences of the local oscillation signals without repeating the process of sending transmissions to the receiver and receiving new phase difference information from the receiver. Therefore, the UE 10 may overcome the above-mentioned deficiencies of the conventional UEs to increase communication efficiency and/or reduce resource consumption.

While the inventive concepts have been particularly shown and described with reference to embodiments thereof, it will be understood that various changes in form and details may be made therein without departing from the spirit and scope of the following claims.

What is claimed is:

1. A device for wireless communication using a plurality of antennas, the device comprising:
    a first local oscillation generator configured to generate a first local oscillation signal for up-converting a first transmission signal;
    a second local oscillation generator configured to generate a second local oscillation signal for up-converting a second transmission signal; and
    a phase difference detector configured to,
        detect a first phase difference between the first local oscillation signal and the second local oscillation signal, and
        generate a first phase compensation signal based on the first phase difference; and
    a data processor configured to generate the first transmission signal and the second transmission signal by respectively converting a first digital signal and a second digital signal and adjust a phase of at least one of the first signal and the second digital signal based on the first phase compensation signal.

2. The device of claim 1, wherein
the first local oscillation generator is configured to generate the first local oscillation signal based on a reference oscillation signal;
the second local oscillation generator is configured to generate the second local oscillation signal based on the reference oscillation signal; and
the phase difference detector comprises,
    a first phase detector configured to detect a first phase of the first local oscillation signal based on the reference oscillation signal,
    a second phase detector configured to detect a second phase of the second local oscillation signal based on the reference oscillation signal, and
    a first phase comparator configured to,
        detect the first phase difference based on the first phase and the second phase, and
        generate the first phase compensation signal based on the first phase difference.

3. The device of claim 2, wherein
the phase difference detector is further configured to perform a sampling operation and a detection operation based on a control signal; and
the first phase detector comprises,
    a memory configured to store an initial phase of the first local oscillation signal during the sampling operation, and
    a phase calculator configured to detect a phase change of the first local oscillation signal from the initial phase during the detection operation as the first phase.

4. The device of claim 3, wherein
the first phase detector further comprises a time difference measurement circuit configured to generate a multi-bit signal based on a time difference between an edge of the reference oscillation signal and an edge of the first local oscillation signal; and
the memory is configured to store a first value of the multi-bit signal as the initial phase during the sampling operation.

5. The device of claim 4,
wherein the phase calculator comprises a magnitude detection circuit configured to detect a magnitude of the first phase by summing a plurality of bits, the plurality of bits being obtained by performing a bitwise XOR operation on the first value of the multi-bit signal and a second value of the multi-bit signal generated during the detection operation.

6. The device of claim 4,
wherein the phase calculator comprises a sign detection circuit configured to detect a sign of the first phase by detecting one of a rising edge or a falling edge of the first local oscillation signal based on one of the first value of the multi-bit signal or a second value of the multi-bit signal generated during the detection operation.

7. The device of claim 4,
wherein the time difference measurement circuit is nearer to the first local oscillation generator than to the second phase detector.

8. The device of claim 2, further comprising:
a third local oscillation generator configured to generate a third local oscillation signal based on the reference oscillation signal for up-converting a third transmission signal,
wherein the phase difference detector further comprises,
a third phase detector configured to detect a third phase of the third local oscillation signal based on the reference oscillation signal, and
a second phase comparator configured to,
detect a second phase difference based on the first phase and the third phase, and
generate a second phase compensation signal for adjusting a phase of the third transmission signal based on the second phase difference.

9. The device of claim 1, wherein the phase difference detector comprises:
a mixer configured to,
receive the first local oscillation signal and the second local oscillation signal, and
output a mixer output signal; and
processing circuitry configured to generate the first phase compensation signal based on an amplitude of the mixer output signal.

10. A device for wireless communication comprising:
a phase difference detector configured to generate a phase compensation signal based on a phase difference between a first local oscillation signal for up-converting a first transmission signal and a second local oscillation signal for up-converting a second transmission signal; and
a data processor configured to generate the first transmission signal and the second transmission signal by respectively converting a first digital signal and a second digital signal and adjust a tease of at least one of the first digital signal and the second digital signal based on the phase compensation signal,
wherein, the phase difference detector comprises processing circuitry configured to,
detect a first phase of a first local oscillation signal based on a first phase change of the first local oscillation signal, the first local oscillation signal being generated based on a reference oscillation signal, the first phase change representing a change from an initial phase of the first local oscillation signal during a sampling operation to a later phase of the first local oscillation signal during a detection operation,
detect a second phase of a second local oscillation signal based on a second phase change of the second local oscillation signal, the second local oscillation signal being generated based on the reference oscillation signal, the second phase change representing a change from an initial phase of the second local oscillation signal during the sampling operation to a later phase of the second local oscillation signal during a detection operation, and
generate the phase compensation signal based on the first phase and the second phase, the phase compensation signal corresponding to a phase difference between the first local oscillation signal and the second local oscillation signal.

11. The device of claim 10, wherein the phase difference detector comprises:
a memory configured to store a first value of a multi-bit signal during the sampling operation,
wherein the processing circuitry is configured to,
generate the multi-bit signal based on a time difference between an edge of the reference oscillation signal and an edge of the first local oscillation signal, and
detect the first phase during the detection operation based on a second value of the multi-bit signal and the first value of the multi-bit signal stored in the memory.

12. The device of claim 11, wherein the processing circuitry is configured to:
delay the first local oscillation signal to generate a delayed first local oscillation signal; and
generate the multi-bit signal by sampling the delayed first local oscillation signal according to the reference oscillation signal.

13. A device for wireless communication using a plurality of antennas, the device comprising:
a plurality of local oscillation generators configured to generate a plurality of local oscillation signals for up-converting a plurality of transmission signals based on a reference oscillation signal;
a phase difference detector configured to,
detect a plurality of phase differences between a first local oscillation signal among the plurality of local oscillation signals and two or more other local oscillation signals among the plurality of local oscillation signals,
generate a plurality of phase compensation signals based on the plurality of phase differences; and
a data processor configured to generate the plurality of transmission signals by respectively converting a plurality of digital signals and adjust a phase of at least one of the plurality of digital signals based on the plurality of phase compensation signals.

14. The device of claim 13,
wherein the data processor is configured to generate the plurality of digital signals by performing a coordinate rotation digital computer (CORDIC) on a plurality of source signals based on the plurality of phase compensation signals.

15. The device of claim 13, wherein the phase difference detector is configured to:
detect a plurality of phases of the plurality of local oscillation signals based on the reference oscillation signal, each of the plurality of phases corresponding to a respective local oscillation signal among the plurality of local oscillation signals; and
detect the plurality of phase differences based on the plurality of phases.

16. The device of claim 15, wherein
the phase difference detector is configured to detect a first phase of a particular local oscillation signal among the plurality of local oscillation signals based on a difference between an initial phase of the particular local oscillation signal detected in a sampling operation and a later phase of the particular local oscillation signal detected in a detection operation, the sampling operation and the detection operation being performed based on a control signal.

17. The device of claim 16,
wherein the control signal causes the phase difference detector to perform the sampling operation in response to a change in a plurality of frequencies of the plurality of local oscillation signals.

18. The device of claim 16,
wherein the control signal causes the phase difference detector to perform the detection operation in response to release of a sleep mode of at least one of the plurality of local oscillation generators.

* * * * *